(12) United States Patent
Haase

(10) Patent No.: US 11,393,907 B2
(45) Date of Patent: Jul. 19, 2022

(54) TRANSISTOR DEVICE WITH BURIED FIELD ELECTRODE CONNECTION

(71) Applicant: Infineon Technologies Austria AG, Villach (AT)

(72) Inventor: Robert Paul Haase, San Pedro, CA (US)

(73) Assignee: Infineon Technologies Austria AG, Villach (AT)

( * ) Notice: Subject to any disclaimer, the term of this patent is extended or adjusted under 35 U.S.C. 154(b) by 29 days.

(21) Appl. No.: 16/991,478

(22) Filed: Aug. 12, 2020

(65) Prior Publication Data

US 2022/0052164 A1    Feb. 17, 2022

(51) Int. Cl.
*H01L 29/40* (2006.01)
*H01L 29/423* (2006.01)
*H01L 29/49* (2006.01)
*H01L 29/66* (2006.01)

(52) U.S. Cl.
CPC .......... *H01L 29/407* (2013.01); *H01L 29/401* (2013.01); *H01L 29/4236* (2013.01); *H01L 29/42364* (2013.01); *H01L 29/4966* (2013.01); *H01L 29/66734* (2013.01)

(58) Field of Classification Search
None
See application file for complete search history.

(56) References Cited

U.S. PATENT DOCUMENTS

| | | | |
|---|---|---|---|
| 2002/0036319 A1 | 3/2002 | Baliga | |
| 2009/0079002 A1 | 3/2009 | Lee et al. | |
| 2009/0090967 A1 | 4/2009 | Chen et al. | |
| 2010/0019314 A1 | 1/2010 | Kachi | |
| 2010/0123188 A1 | 5/2010 | Venkatraman | |
| 2012/0153386 A1 | 6/2012 | Hirler et al. | |
| 2013/0168761 A1 | 7/2013 | Hsieh | |
| 2013/0234241 A1 | 9/2013 | Bowers | |
| 2013/0328122 A1 | 12/2013 | Li et al. | |
| 2014/0027813 A1* | 1/2014 | Kuruc | H01L 29/7396 257/139 |

(Continued)

FOREIGN PATENT DOCUMENTS

| | | |
|---|---|---|
| DE | 102015200809 A1 | 7/2016 |
| WO | 2009026174 A1 | 2/2009 |

*Primary Examiner* — Hsien Ming Lee
(74) *Attorney, Agent, or Firm* — Murphy, Bilak & Homiller, PLLC

(57) ABSTRACT

A semiconductor device includes: a semiconductor substrate; trenches formed in the substrate and extending lengthwise in parallel with one another, the trenches having connecting regions which interconnect adjacent ones of the trenches; semiconductor mesas separated from one another by the trenches in a first lateral direction and by the connecting regions in a second lateral direction transverse to the first lateral direction; a gate electrode and a field electrode below the gate electrode in at least some of the trenches, and dielectrically insulated from each other and from the semiconductor substrate; first contacts vertically extending into one or more transistor device regions in the semiconductor mesas; and second contacts vertically extending into the field electrodes in the connecting regions such that the gate electrodes are uninterrupted by the second contacts. Corresponding methods of producing such a semiconductor device are also described.

22 Claims, 37 Drawing Sheets

(56) References Cited

U.S. PATENT DOCUMENTS

| | | | |
|---|---|---|---|
| 2014/0097863 A1 | 4/2014 | Zundel et al. | |
| 2016/0064546 A1 | 3/2016 | Zitouni et al. | |
| 2016/0071974 A1 | 3/2016 | Laven et al. | |
| 2016/0104773 A1 | 4/2016 | Kelkar et al. | |
| 2016/0104797 A1 | 4/2016 | Poelzl et al. | |
| 2016/0329423 A1 | 11/2016 | Kawahara et al. | |
| 2017/0170274 A1 | 6/2017 | Wutte et al. | |
| 2018/0114857 A1 | 4/2018 | Okada et al. | |
| 2018/0226481 A1* | 8/2018 | Wutte | H01L 29/66734 |
| 2018/0277637 A1 | 9/2018 | Meiser et al. | |
| 2019/0198660 A1 | 6/2019 | Kachi | |
| 2019/0259870 A1 | 8/2019 | Meiser | |
| 2019/0280117 A1 | 9/2019 | Mirchandani et al. | |
| 2020/0161437 A1 | 5/2020 | Meiser et al. | |
| 2020/0212218 A1* | 7/2020 | Kim | H01L 29/404 |

* cited by examiner

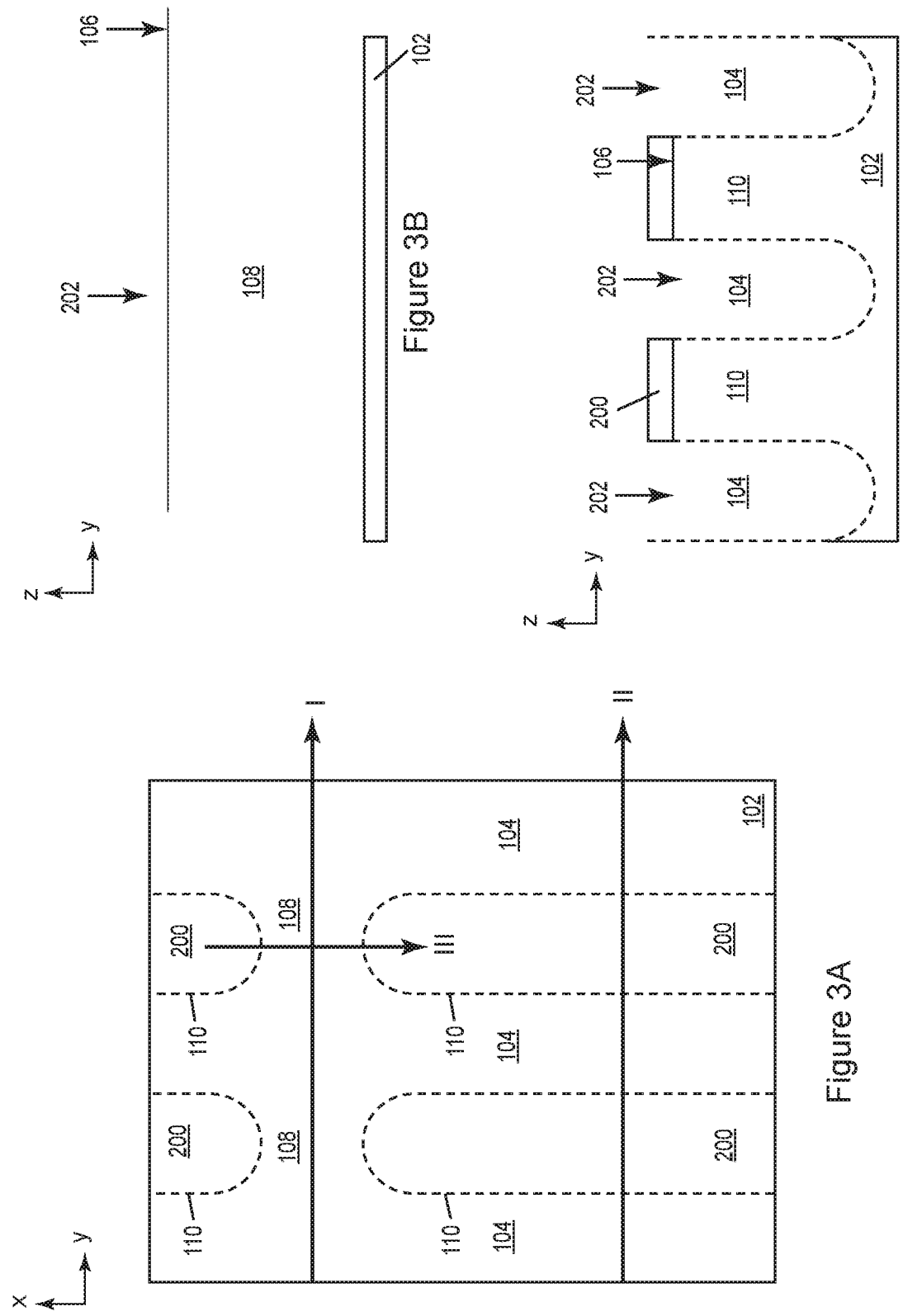

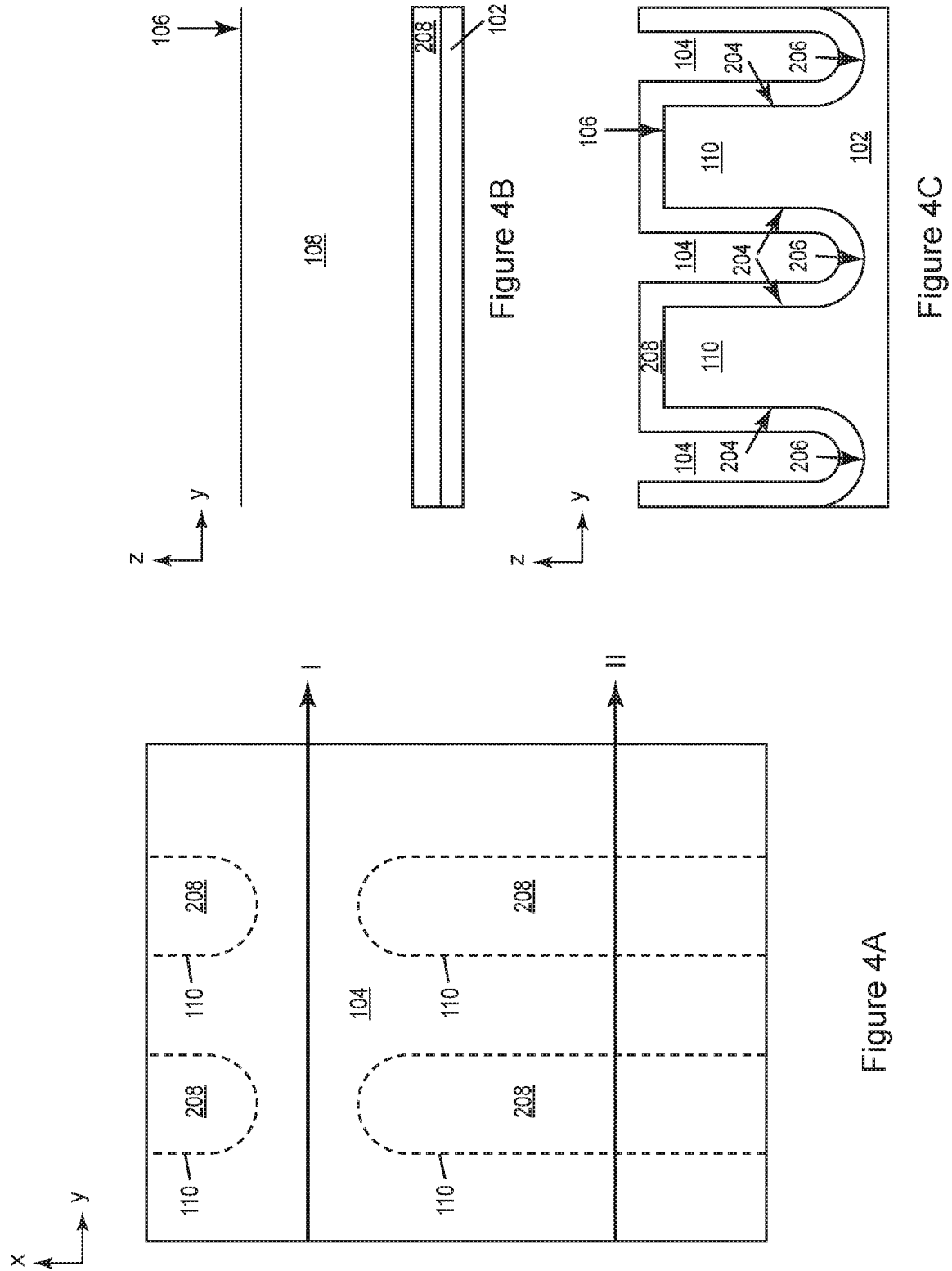

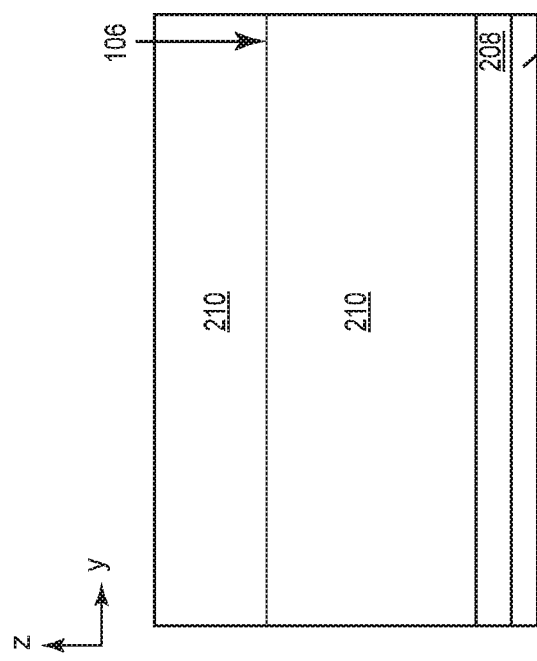
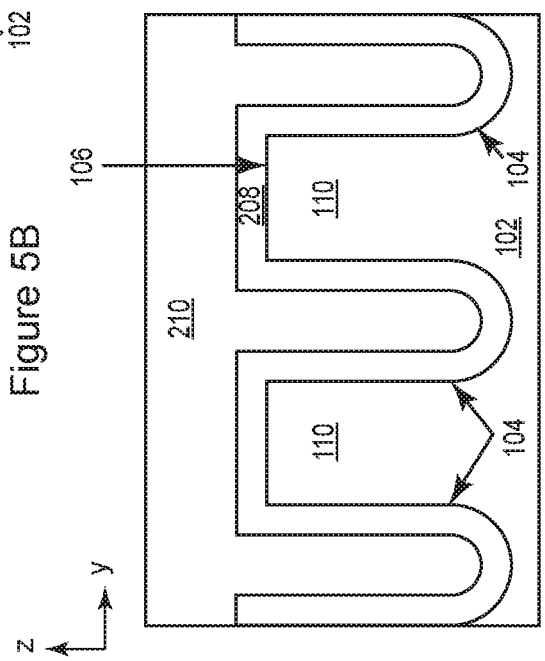
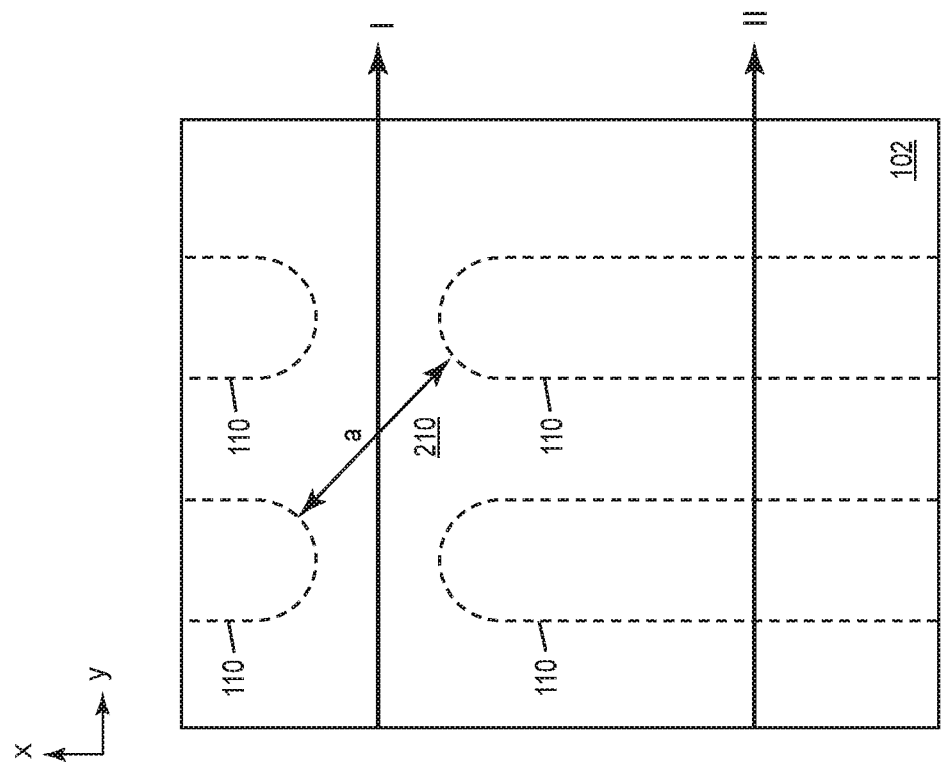

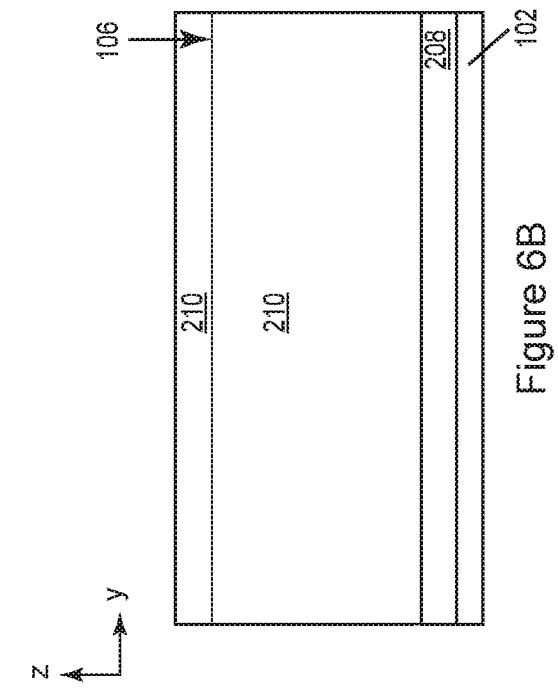
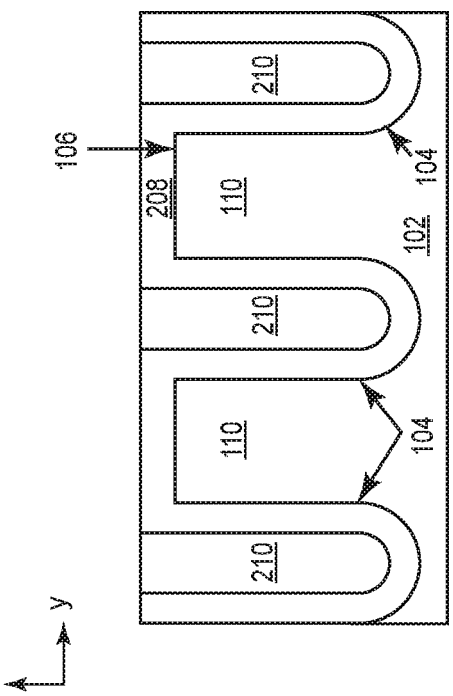
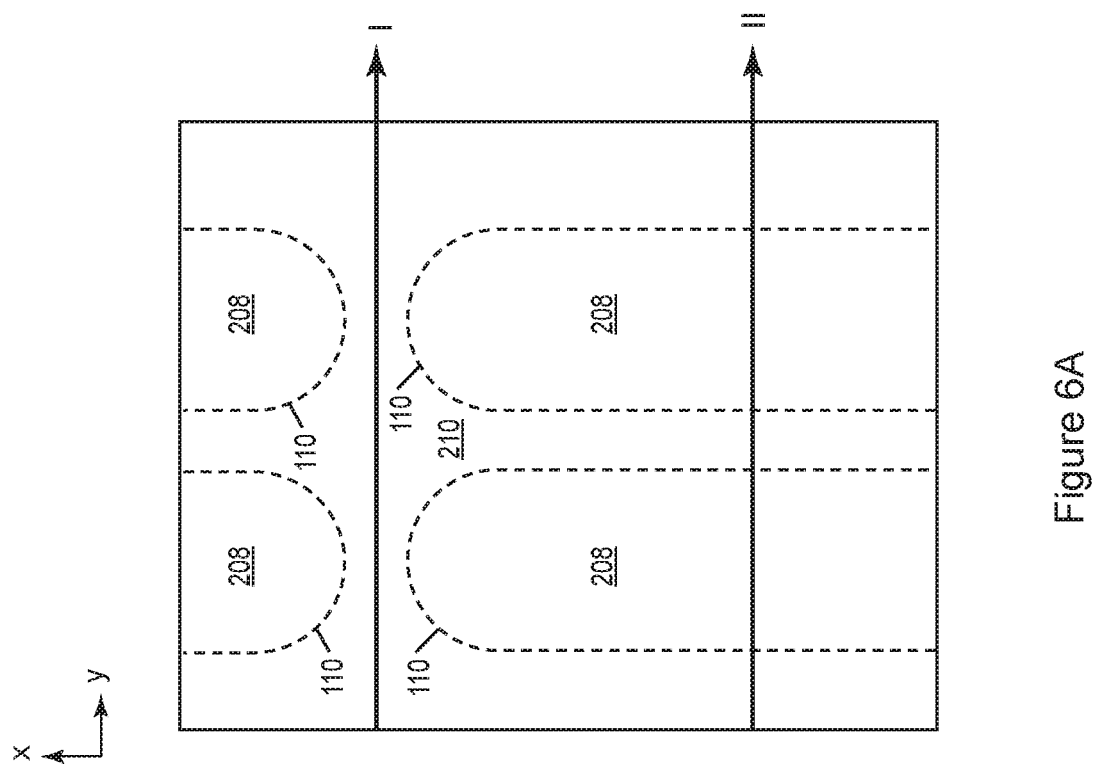

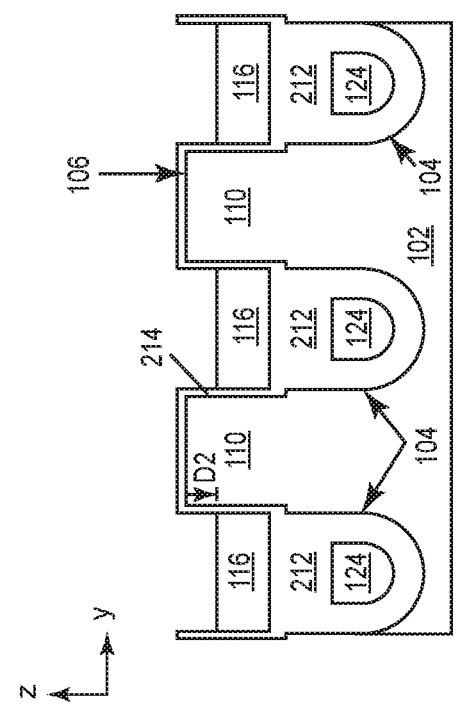
Figure 9B
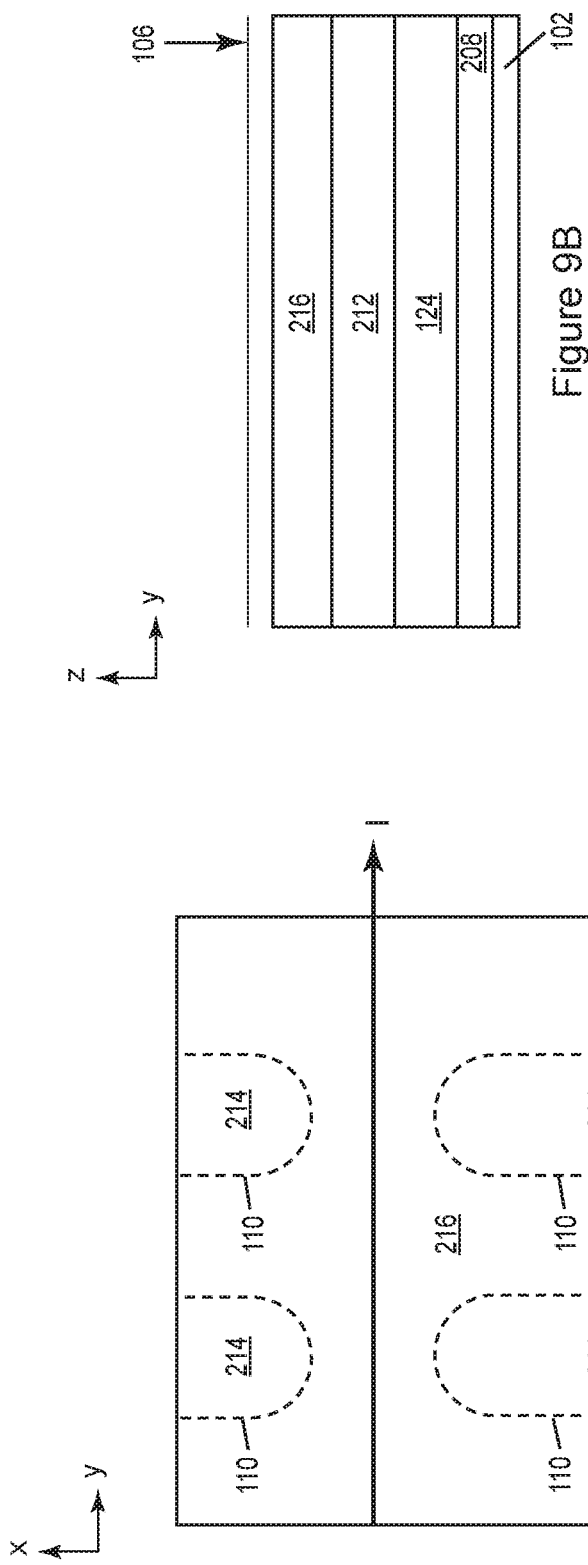
Figure 9C
Figure 9A

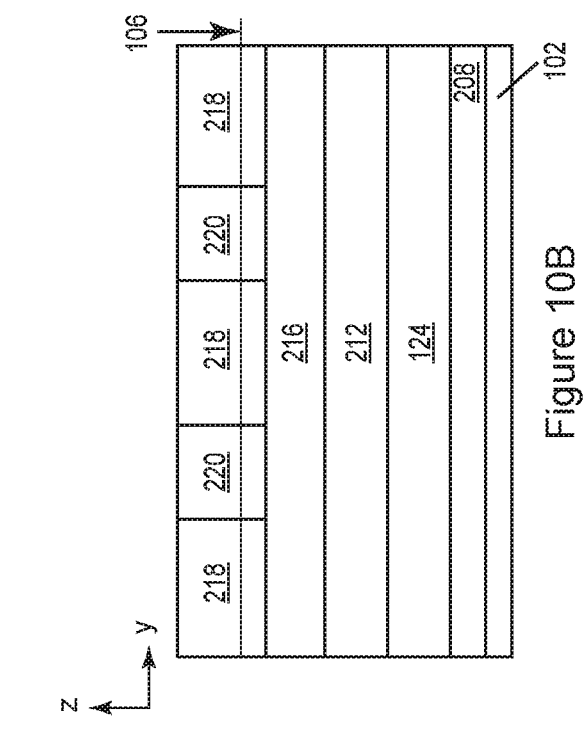
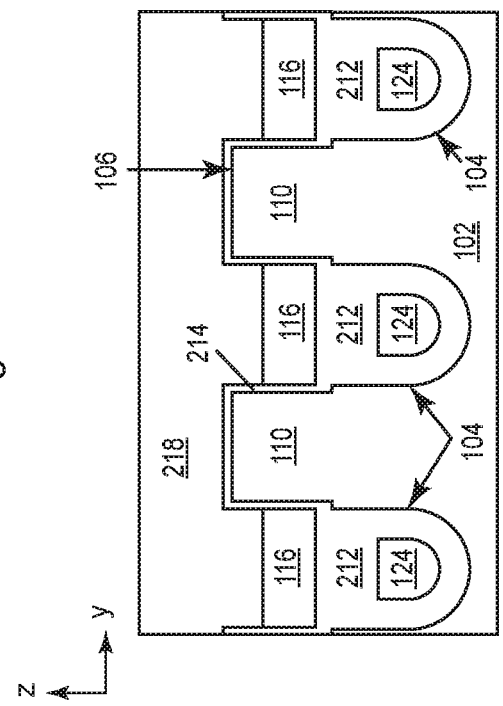
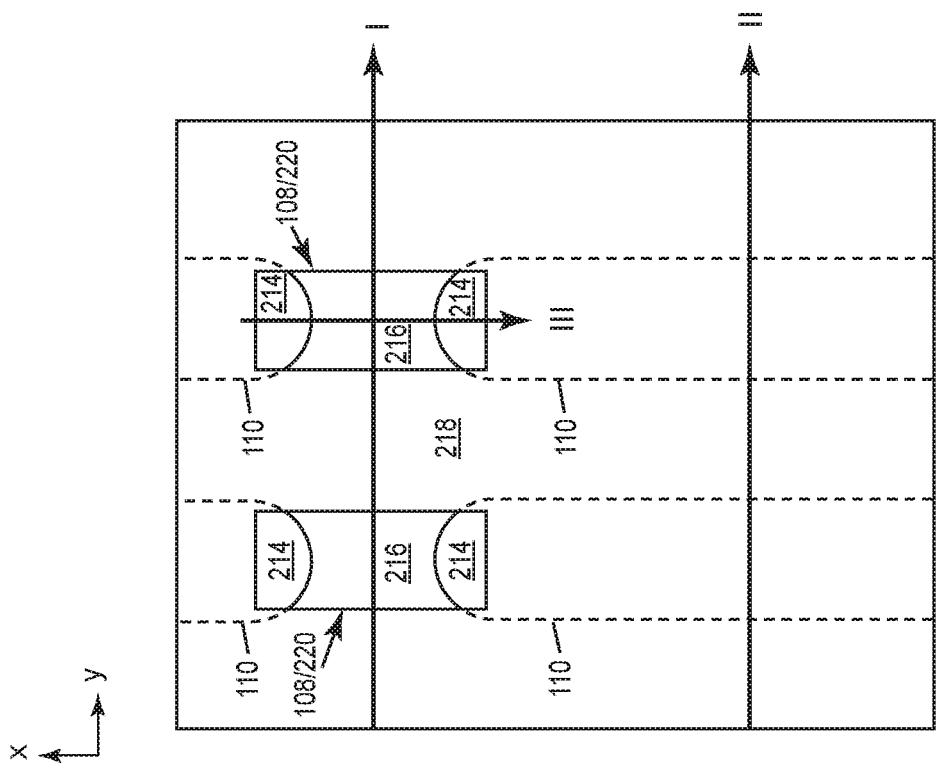

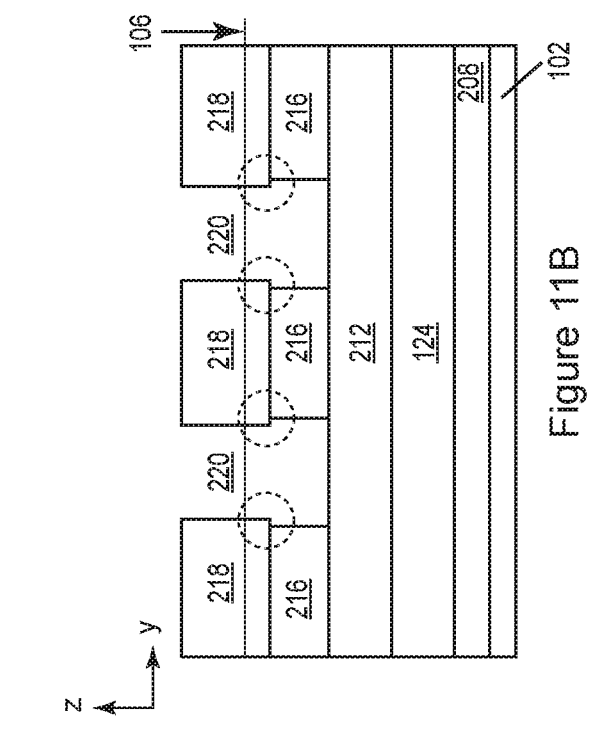
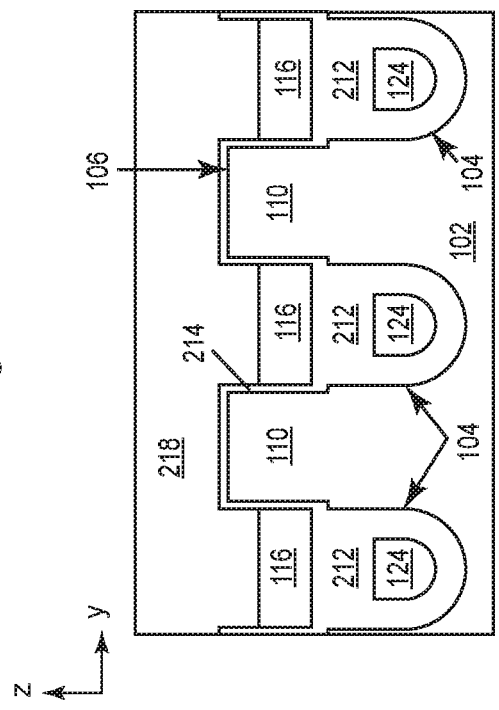
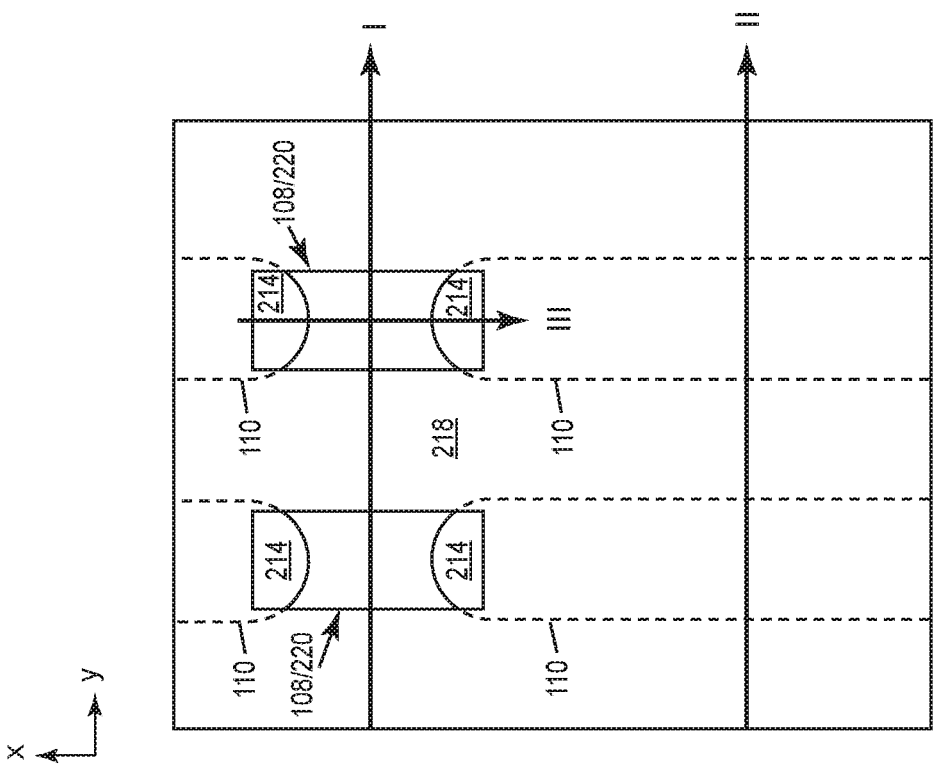
Figure 11B
Figure 11C
Figure 11A

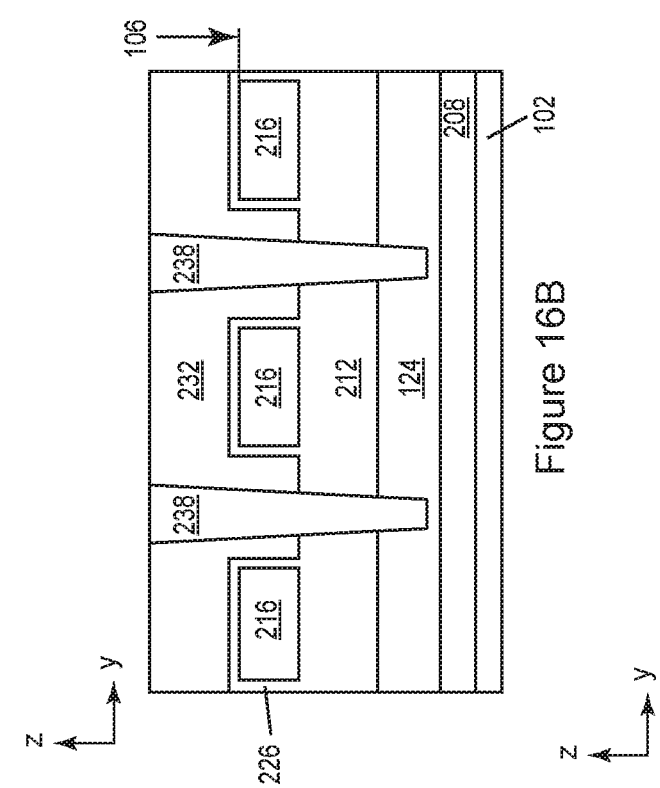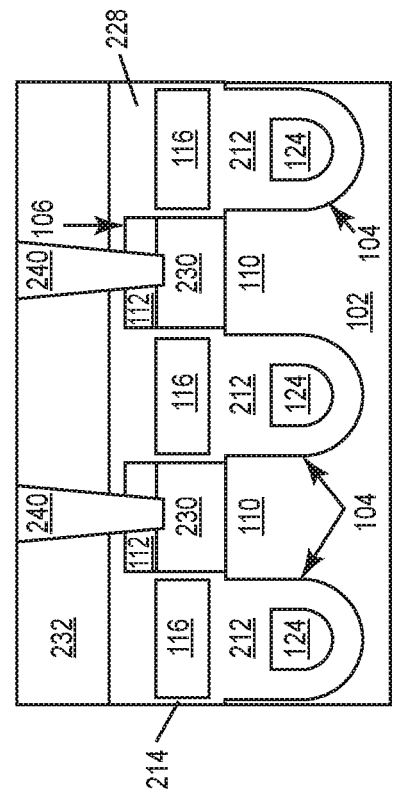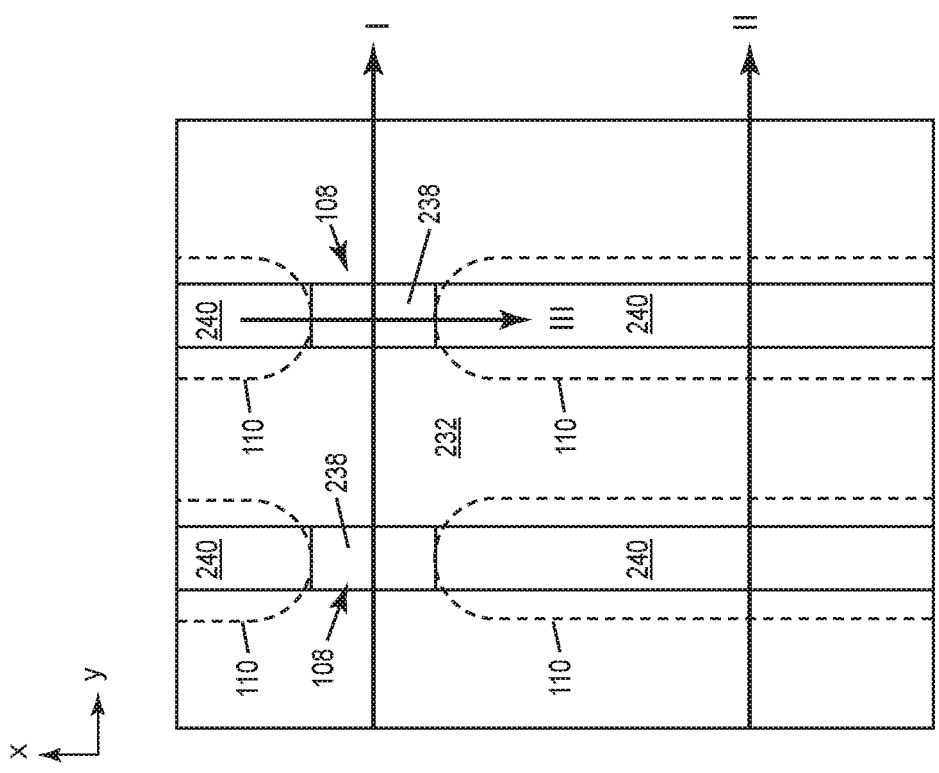
Figure 16B
Figure 16C
Figure 16A

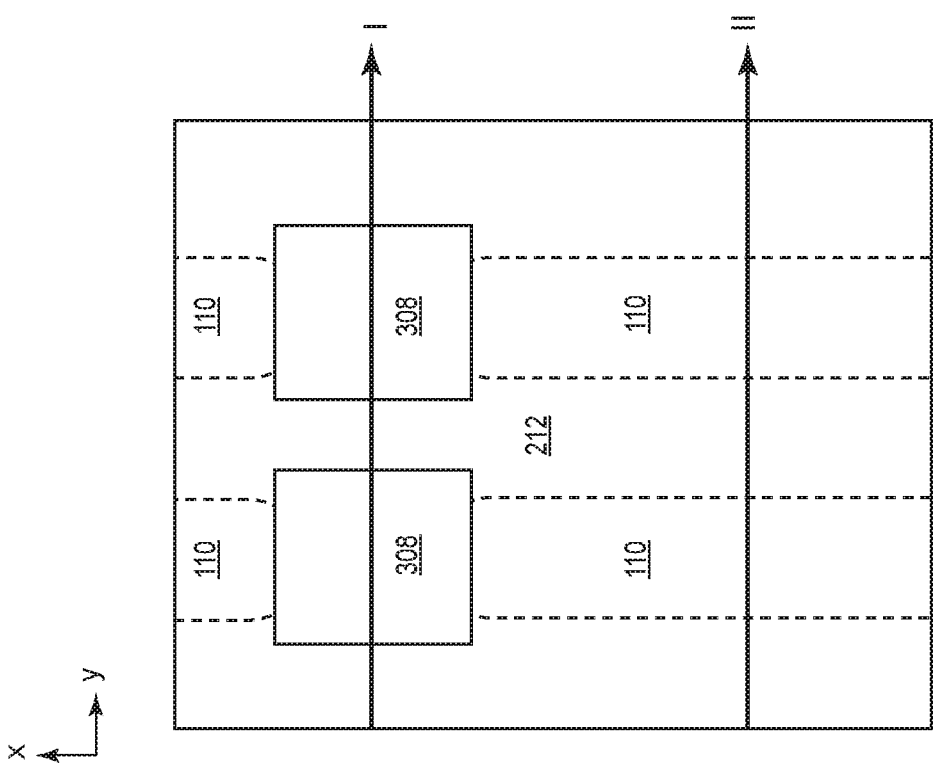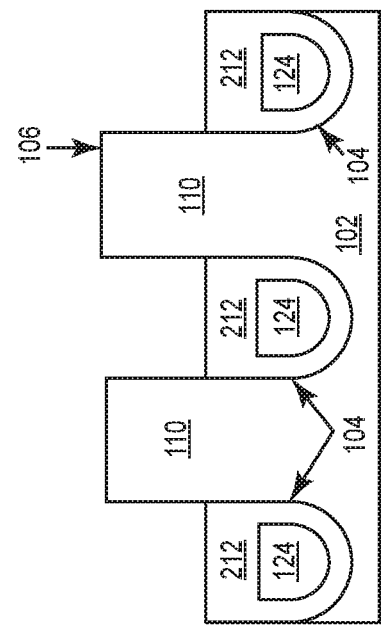
Figure 20B
Figure 20C
Figure 20A

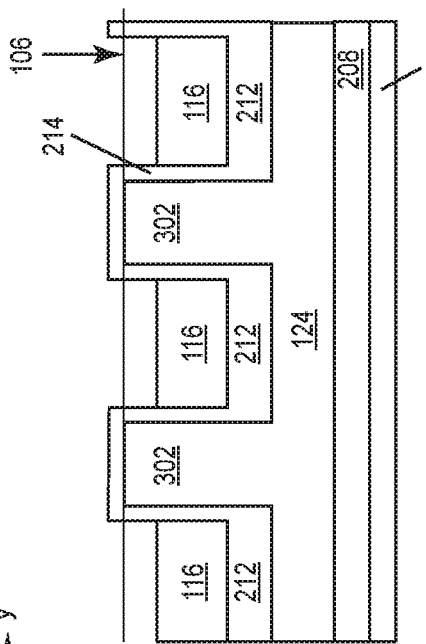
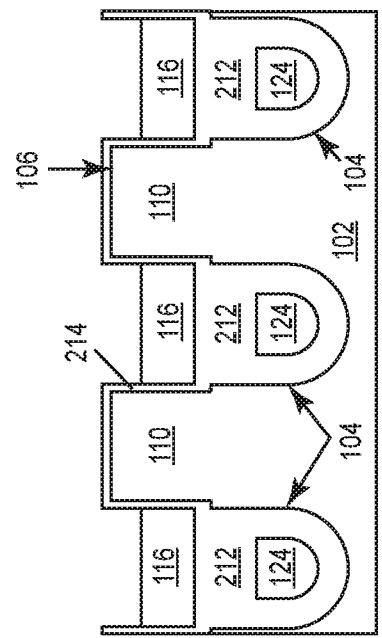
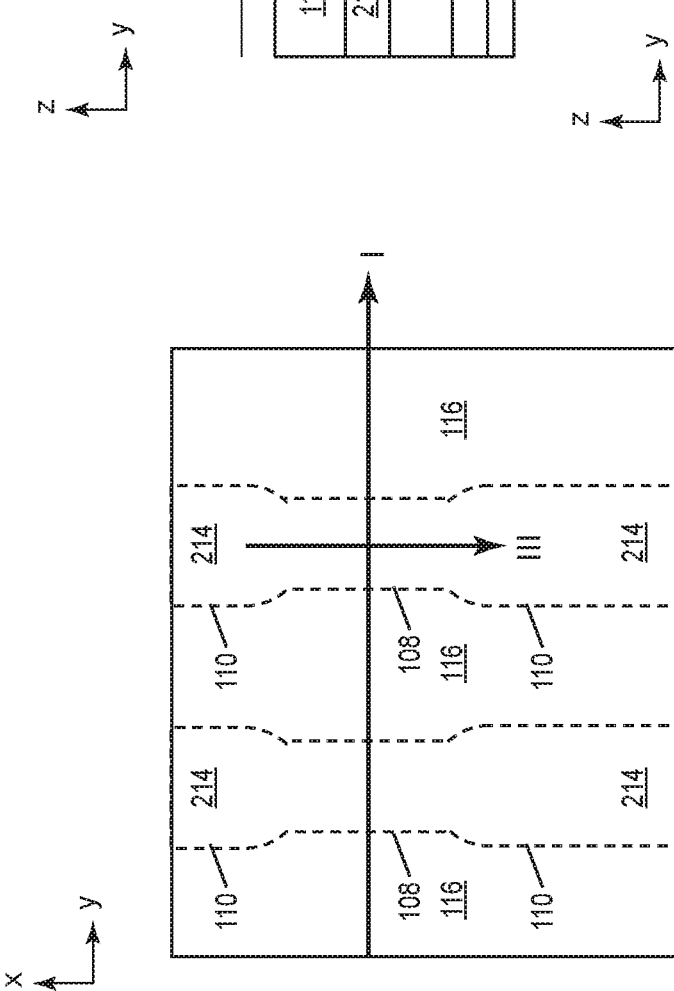
Figure 21B
Figure 21C
Figure 21A

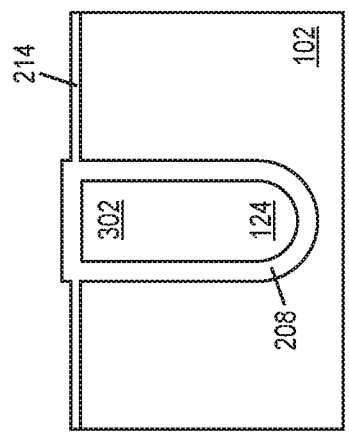

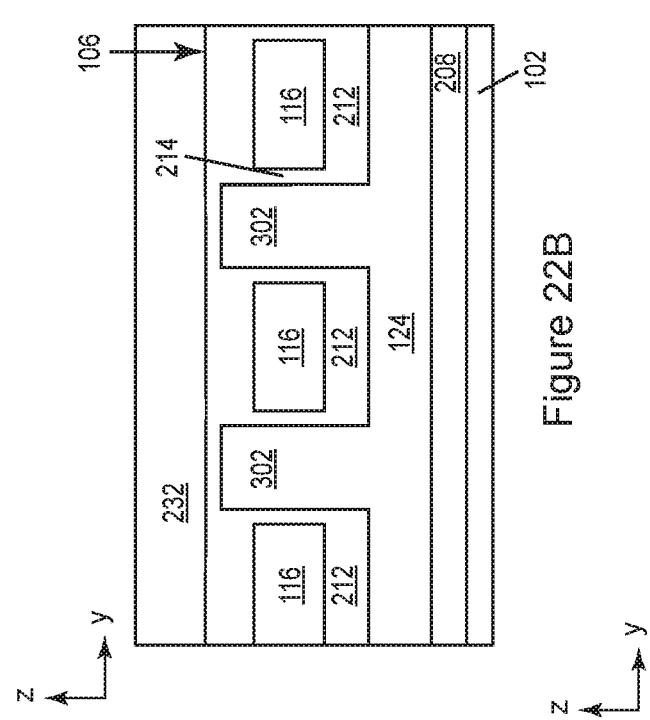
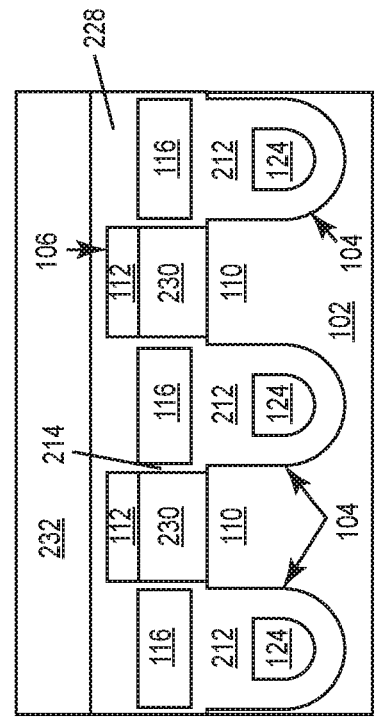
Figure 22B
Figure 22C
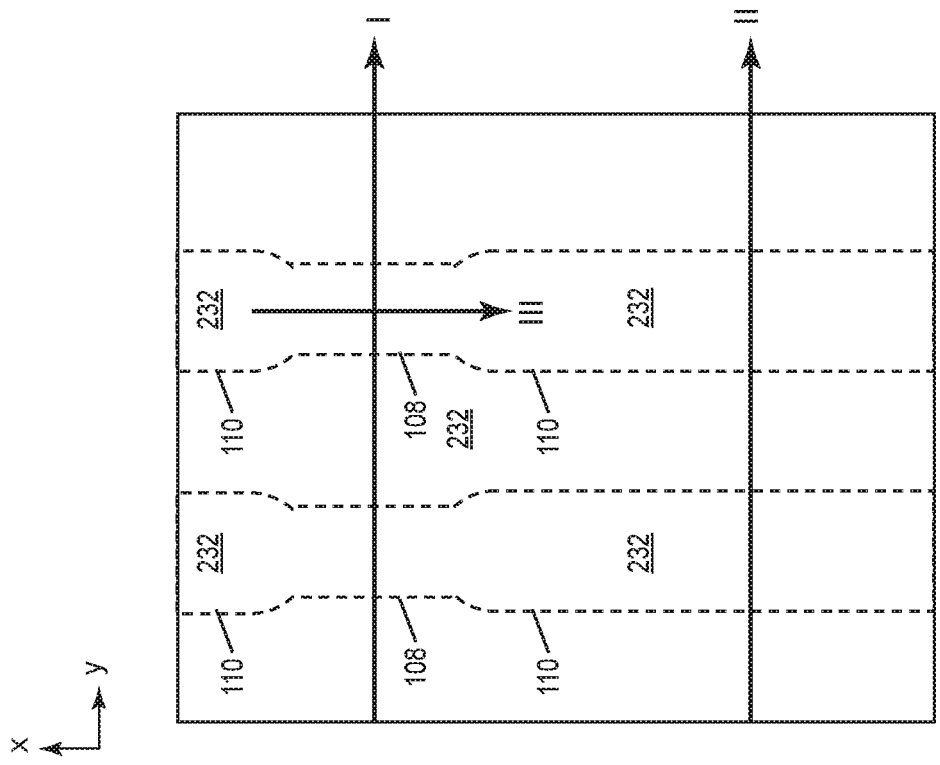
Figure 22A

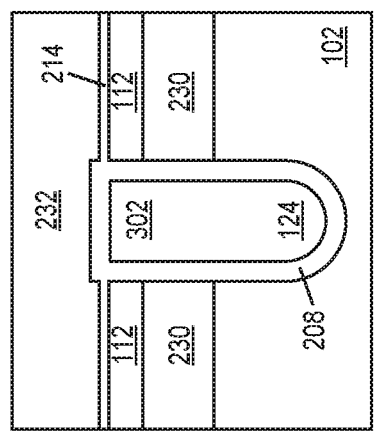

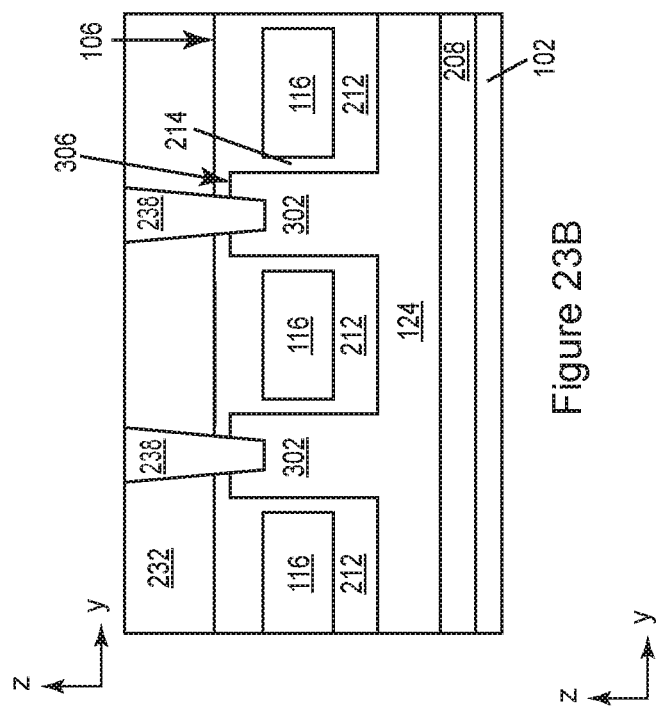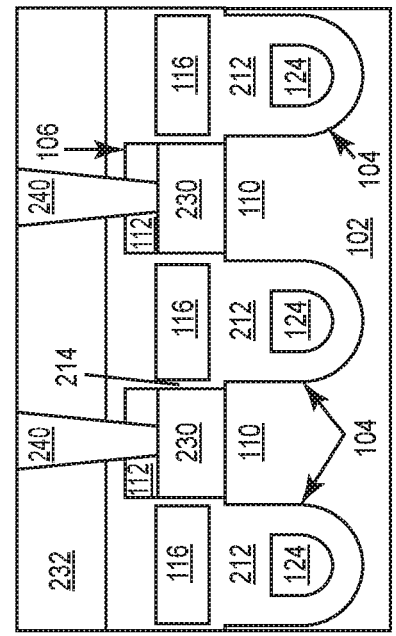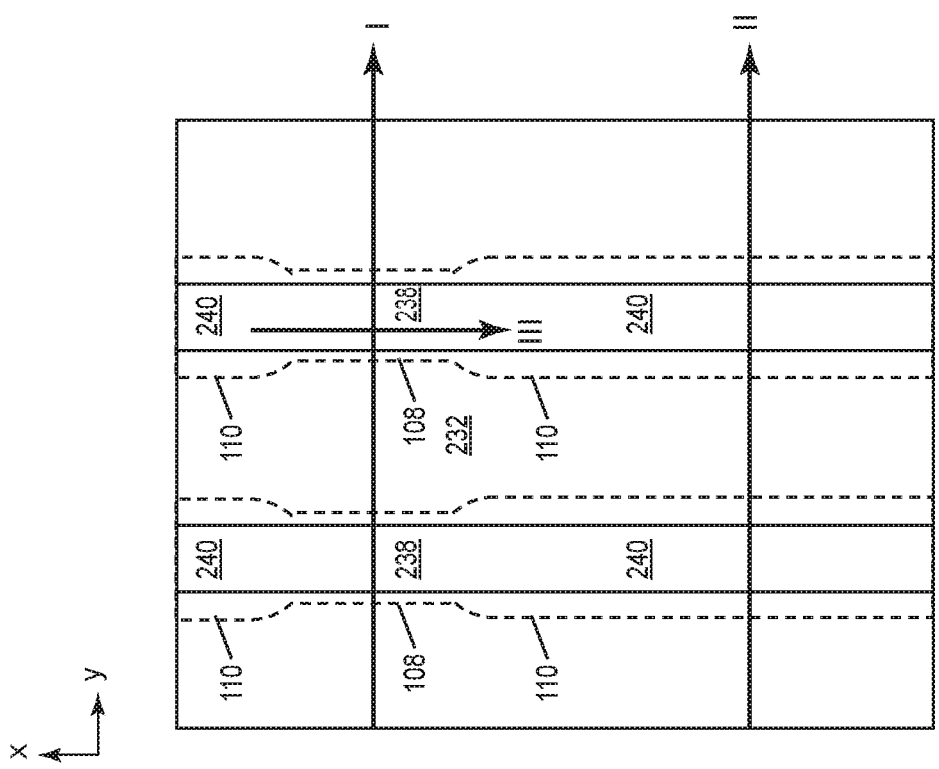

US 11,393,907 B2

TRANSISTOR DEVICE WITH BURIED FIELD ELECTRODE CONNECTION

BACKGROUND

Many types of power transistors such as power MOSFETs (metal-oxide-semiconductor field-effect transistors) utilize trenches that contain both gate electrodes and field electrodes below the gate electrodes. The field electrodes help to shape the electric field distribution within the device, thereby increasing the breakdown voltage characteristics of the device. However, as cell dimensions for power transistors continue to shrink, the corresponding interconnect dimensions also shrink which results in higher resistance. For field plate (electrode) trench power MOSFETs, this means the resistance of the field plate material which is typically polysilicon becomes higher. To counter this effect, more frequent connections from higher resistance polysilicon field electrodes to lower resistance source metal is needed. Each time a connection is made between source metal and field plate polysilicon, valuable active transistor area is consumed which results in an increase of $RDS_{ON}*AA$ and therefore chip size where $RDS_{ON}$ is on-state resistance and AA is active area. For example, some conventional approaches interrupt the overlying gate electrode to connect the underlying buried field electrode to source metal. Such approaches require an accompanying additional metal connection to gate metal (gate bus) and a source bus for connecting source metal to the buried field electrodes.

Thus, there is a need for an improved buried field plate connection for transistor devices and corresponding methods of manufacture.

SUMMARY

According to an embodiment of a semiconductor device, the semiconductor device comprises: a semiconductor substrate; a plurality of trenches formed in the semiconductor substrate and extending lengthwise in parallel with one another, the plurality of trenches having connecting regions which interconnect adjacent ones of the trenches; semiconductor mesas separated from one another by the plurality of trenches in a first lateral direction and by the connecting regions in a second lateral direction transverse to the first lateral direction; a gate electrode and a field electrode below the gate electrode in at least some of the trenches, and dielectrically insulated from each other and from the semiconductor substrate; first contacts vertically extending into one or more transistor device regions in the semiconductor mesas; and second contacts vertically extending into the field electrodes in the connecting regions such that the gate electrodes are uninterrupted by the second contacts.

According to an embodiment of a method of producing a semiconductor device, the method comprises: forming a plurality of trenches in a semiconductor substrate and which extend lengthwise in parallel with one another, wherein the plurality of trenches have connecting regions which interconnect adjacent ones of the trenches, wherein semiconductor mesas are separated from one another by the plurality of trenches in a first lateral direction and by the connecting regions in a second lateral direction transverse to the first lateral direction; forming a gate electrode and a field electrode below the gate electrode in at least some of the trenches, and dielectrically insulated from each other and from the semiconductor substrate; forming first contacts which vertically extend into one or more transistor device regions in the semiconductor mesas; and forming second contacts which vertically extend into the field electrodes in the connecting regions such that the gate electrodes are uninterrupted by the second contacts.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 17D illustrate different views at different stages of an embodiment of a method of producing the semiconductor device shown in FIGS. 1A to 1C.

FIGS. 18A through 23D illustrate different views at different stages of an embodiment of forming the field electrode connections for the semiconductor device shown in FIGS. 1A to 1C.

DETAILED DESCRIPTION

The embodiments described herein provide a connection between buried field electrodes and source metal without interrupting the overlying gate electrodes. Accordingly, the gate electrodes, which may be disposed in trenches, extend uninterrupted over the length of the trenches. Such a buried field electrode connection technique allows for disproportionate/independent source and gate bus connections which can be leveraged, e.g., to optimize switching characteristics in a system, an option to add source bus contacts without gate bus contacts, reduced gate bus count for a low resistivity gate implementation, snubber trimming, increased active area to reduce $RDS_{ON}*AA$, and reduced chip size and therefore lower overall chip cost. Described next are various embodiments of a semiconductor device that includes a connection between buried field electrodes and source metal without interrupting the overlying gate electrode, and corresponding methods of production.

Figure 1A:
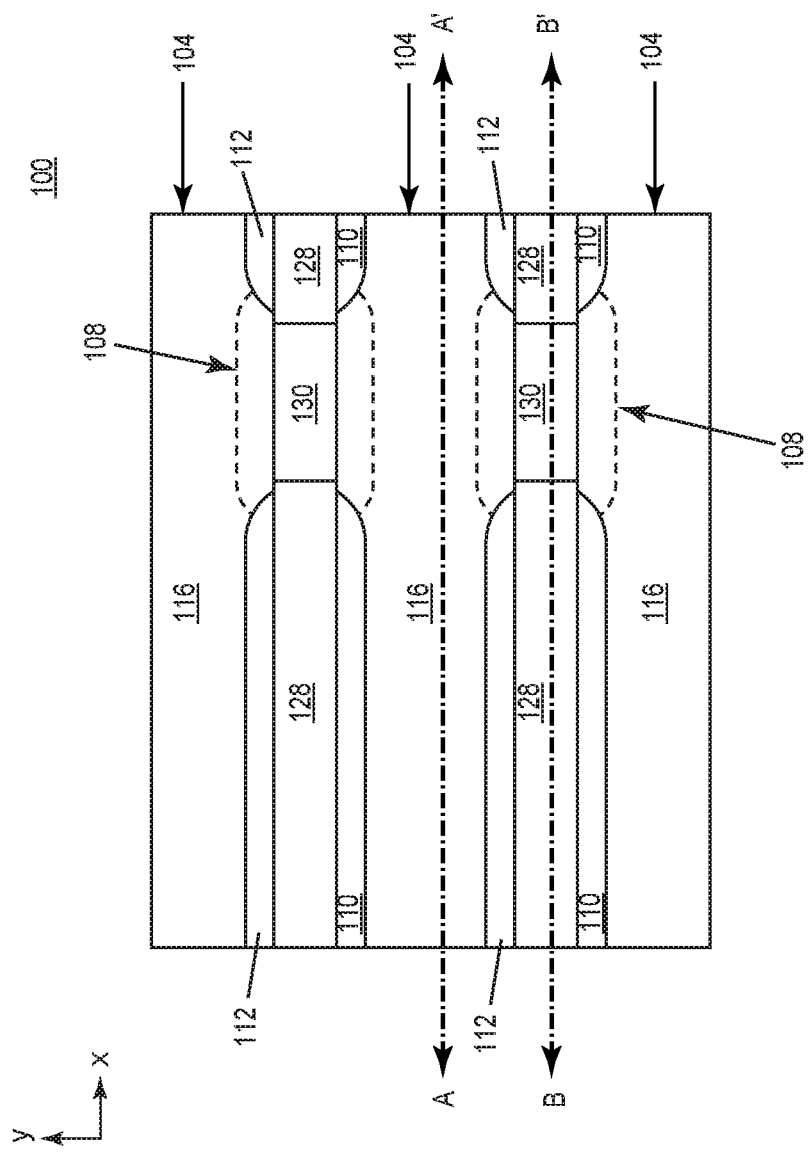
FIG. 1A illustrates a top down plan view of part of a semiconductor device having a buried field electrode connection.
Figure 1B:
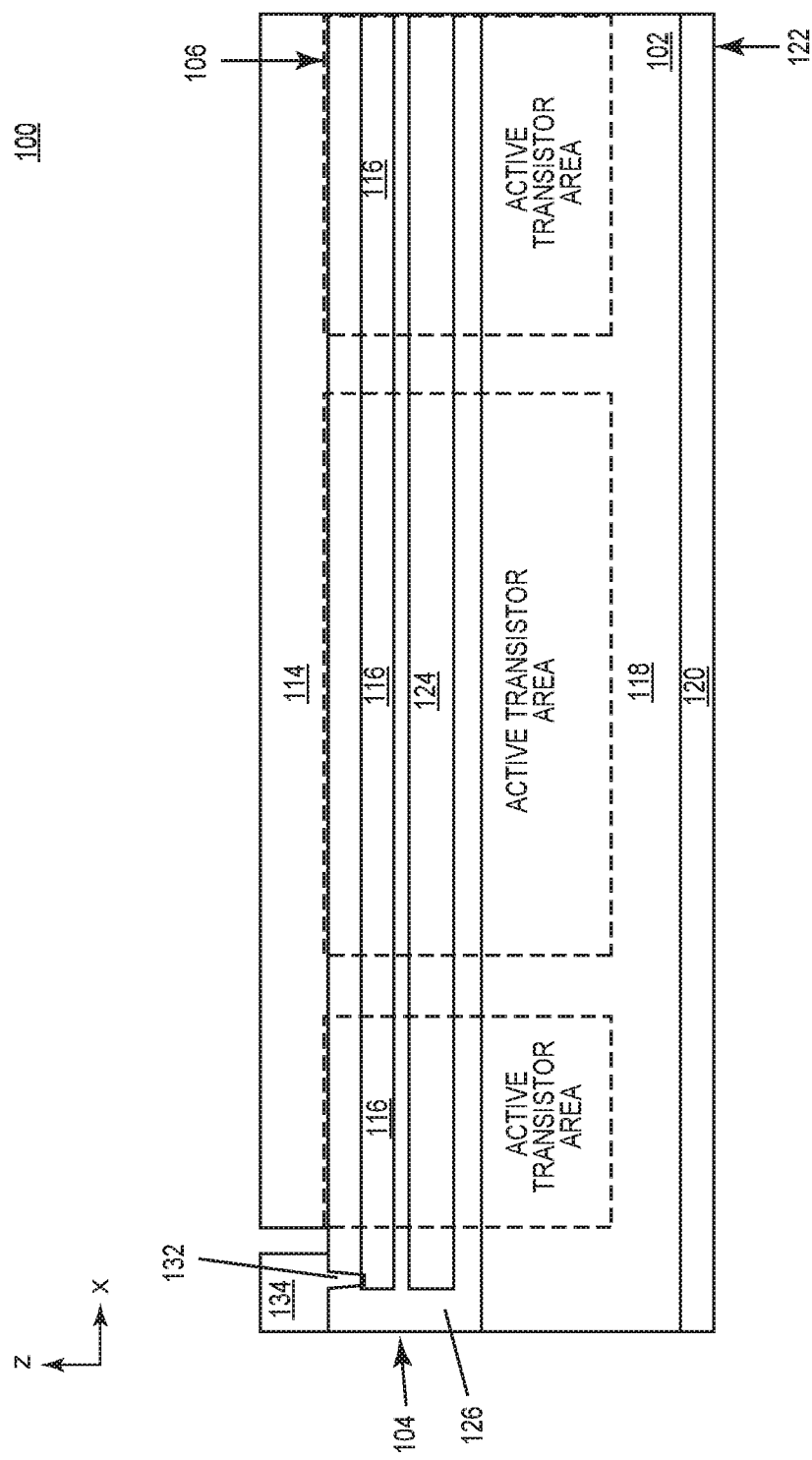
FIG. 1B illustrates a cross-sectional view of the semiconductor device taken along the line labelled A-A' in FIG. 1A.
Figure 1C:
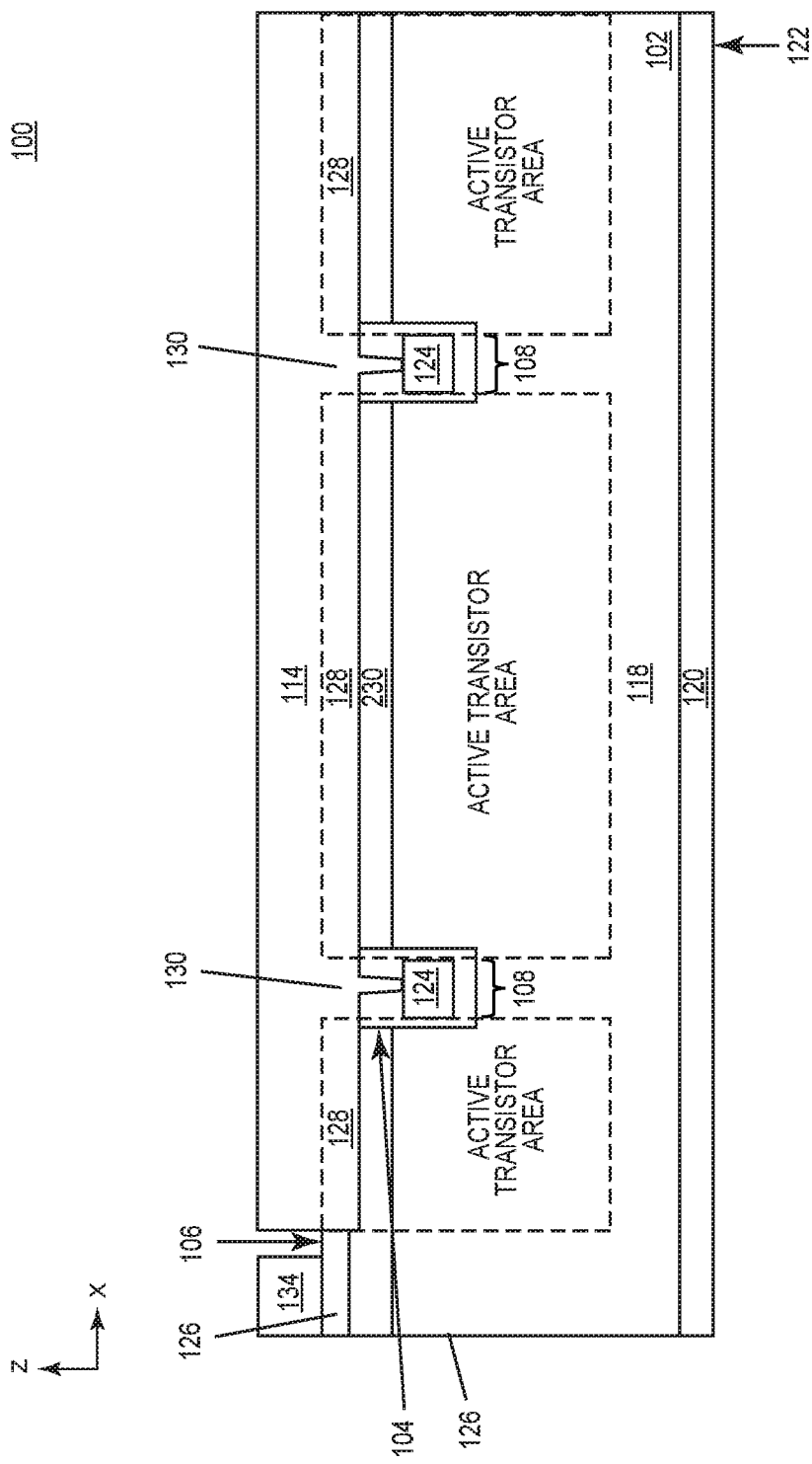
FIG. 1C illustrates a cross-sectional view of the semiconductor device taken along the line labelled B-B' in FIG. 1A.

FIG. 1A illustrates a top plan view of part of a semiconductor device 100. FIG. 1B illustrates a cross-sectional view of the semiconductor device 100 taken along the line labelled A-A' in FIG. 1A. FIG. 1C illustrates a cross-sectional view of the semiconductor device 100 taken along the line labelled B-B' in FIG. 1A. The cross-section of FIGS. 1B and 1C both include a larger part of the device 100 than what is shown in FIG. 1A. For example, the cross-sections of FIGS. 1B and 1C both include an end of a trench region whereas FIG. 1A does not.

In one embodiment, the semiconductor device 100 is a power MOSFET. However, the semiconductor device 100 may instead be an IGBT (insulated gate bipolar transistor), HEMT (high electron mobility transistor) or other type of power transistor device.

In each case, the semiconductor device 100 includes a semiconductor substrate 102 and trenches 104 formed in the semiconductor substrate 102. The trenches 104 vertically extend (z-direction in FIGS. 1B and 1C) from a first main surface 106 of the semiconductor substrate 102 and into the substrate 102. The semiconductor substrate 102 may include a semiconductor base and one or more epitaxial layers grown on the semiconductor base. The semiconductor substrate 102 may be made of a single semiconductor such as Si, Ge, etc. or may be made of a compound semiconductor such as SiC, GaN, SiGe, etc.

The trenches 104 formed in the semiconductor substrate 102 extend lengthwise (x-direction in FIGS. 1A and 1B) in parallel with one another and have connecting regions 108 which interconnect adjacent ones of the trenches 104 in a direction (y-direction in FIG. 1A) transverse to the lengthwise extension of the trenches 104. Semiconductor mesas 110 are separated from one another by the trenches 104 in a first lateral direction (y-direction in FIG. 1A) and by the trench connecting regions 108 in a second lateral direction (x-direction in FIGS. 1A and 1B) transverse to the first lateral direction.

One or more transistor device regions are formed in the semiconductor mesas 110. For example, a source region 112 of a first conductivity type and a body region 230 of a second conductivity type below the source region 112 are formed in the semiconductor mesas 110. In the case of an n-channel device, the first conductivity type is n-type and the second conductivity type is p-type. Conversely, the first conductivity type is p-type and the second conductivity type is n-type in the case of a p-channel device.

The (buried) body region 230 may be contacted by a highly doped contact region (not shown) of the second conductivity type so that an ohmic contact is formed between an overlying source metal layer 114 and both the source region 112 and the body region 230 formed in the semiconductor mesas 110. The source metal layer 114 is not shown in FIG. 1A to provide an unobstructed view of the semiconductor substrate 102.

A transistor channel forms in each body region 230 along the sidewalls of the corresponding trench 104 when an appropriate voltage is applied to a gate electrode 116 disposed in the upper part of the trench 104, the channel region electrically connecting the source region 112 to a drift zone 118 which is part of the semiconductor substrate 102. The body region 230 separates each source region 112 from the drift zone 118. In the case of a vertical transistor device, a drain region 120 of the first conductivity type may be formed between the drift zone 118 and a second main surface 122 of the semiconductor substrate 102.

Regardless of device type, the semiconductor device 100 also includes a field electrode 124 below the gate electrode 116 in at least some of the trenches 104. The field electrodes 124 and the gate electrodes 116 are dielectrically insulated from each other and from the semiconductor substrate 102 by one or more dielectric materials 126. In one embodiment, the field electrodes 124 and the gate electrodes 116 comprise polysilicon.

First contacts 128 vertically extend (z-direction in FIGS. 1B and 1C) into one or more transistor device regions in the semiconductor mesas 110. For example, the first contacts 128 may vertically extend through the source region 112 and into the body region 230 in the semiconductor mesas 110. Second contacts 130 vertically extend (z-direction in FIG. 1A) into the field electrodes 124 in the trench connecting regions 108 such that the gate electrodes 116 are uninterrupted by the second contacts 130, providing more active transistor area and thus lower $RDS_{ON}$.

The first contacts 128 electrically connect one or more transistor device regions (e.g. source and body regions) in the semiconductor mesas 110 to the overlying source metal layer 114. The second contacts 130 electrically connect the buried field electrodes 124 to the overlying source metal layer 114 or to another metal layer (x-direction in FIGS. 1A to 1C). In one embodiment, the first contacts 128 and the second contacts 130 comprise the same material such as a metal or metal alloy and are formed during deposition of the source metal layer 114. Third contacts connect the gate electrodes 116 to a gate bus 134, e.g., at one or both ends of the trenches 104 (x-direction in FIGS. 1A to 1C).

Interconnecting adjacent ones of the trenches 104 by the trench connecting regions 108 interrupts the semiconductor mesas 110 one or more times along the lengthwise extension (x-direction in FIGS. 1A to 1C) of the trenches 104. Doing so allows for contacting the buried field electrodes 124 without interrupting the gate electrodes 116.

FIGS. 2A through 17D illustrate an embodiment of producing the semiconductor device 100 shown in FIGS. 1A to 1C. In FIGS. 2A through 17D, each 'A' figure represents a partial top plan view, each 'B' figure represents a cross-sectional view through the line labelled 'I' of the corresponding figure, each 'C' figure represents a cross-sectional view through the line labelled of the corresponding figure, and each 'D' figure represents a cross-sectional view through the line labelled of the corresponding figure. Cross-sections 'I' and 'II' run transverse (y-direction) to the lengthwise extension (x-direction) of the trenches 104, whereas cross-section 'III' runs parallel (x-direction) to the lengthwise extension of the trenches 104. Cross-section 'I' is taken across a pair of trench connecting regions 108 where the corresponding semiconductor mesas 110 are interrupted. Cross-section 'II' is taken across a pair of semiconductor mesas 110. Not all illustrated method steps include the three cross-sectional views 'I', 'II', 'III'.

Figure 2B:
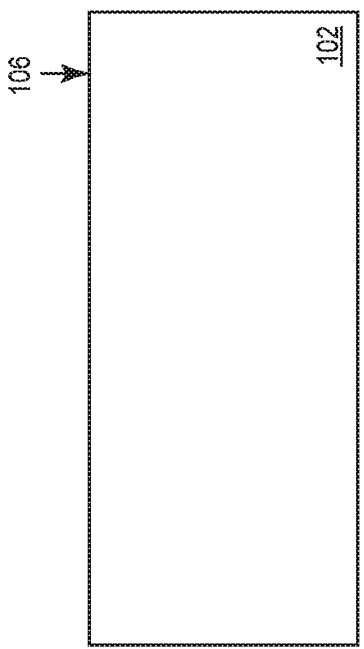
Figure 2C:
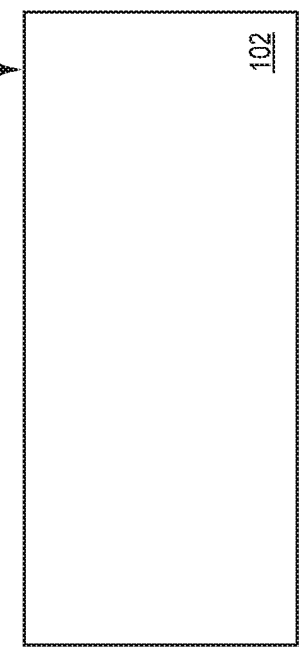
Figure 2A:
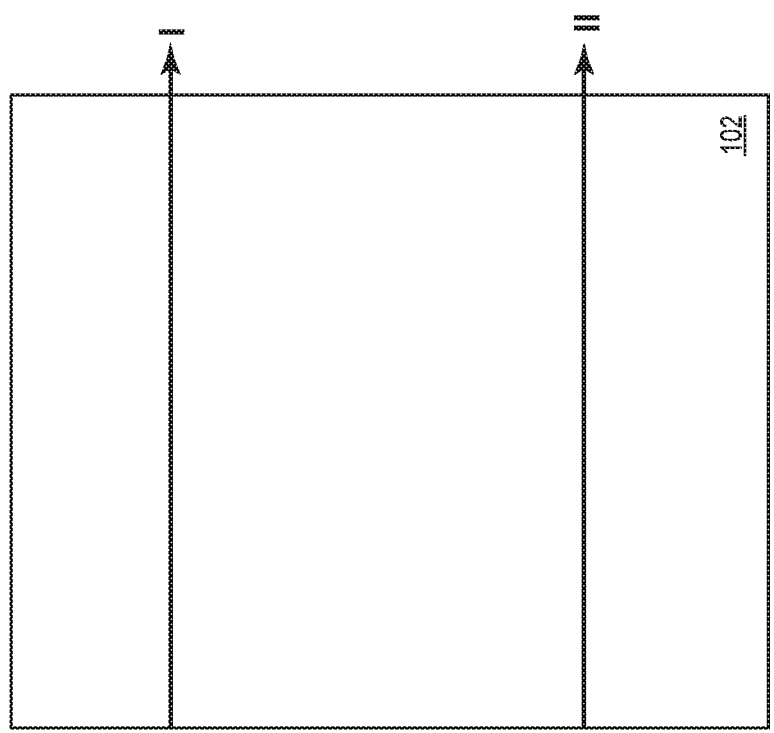
Figure 3D:
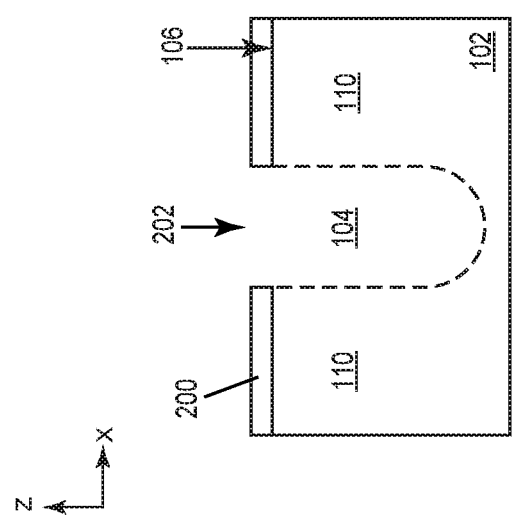

FIGS. 2A through 2C show the semiconductor substrate 102 prior to trench formation. As explained above, the semiconductor substrate 102 may include a semiconductor base and one or more epitaxial layers grown on the semiconductor base and may be made of a single semiconductor such as Si, Ge, etc. or may be made of a compound semiconductor such as SiC, GaN, SiGe, etc. The semiconductor substrate 102 may have a basic doping of the first conductivity type to form the drift zone 118 of the power transistor device 100, for example.

FIGS. 3A through 3D show the semiconductor substrate 102 after the trenches 104 are formed in the first main surface 106 of the substrate 102. In one embodiment, the trenches 102 are formed by forming a mask 200 on the first main surface 106 of the semiconductor substrate 102. The mask 200 defines a location of the semiconductor mesas 110 which are illustrated as dashed lines in FIG. 3A since the mesas 110 are covered by the mask 200 in this view. The mask has regions 202 which are separated from one another in the first lateral direction (x-direction) and in the second lateral direction (y-direction). The trenches 104 are etched into the unmasked part of the first main surface 106 of the semiconductor substrate 102.

FIGS. 4A through 4C show the semiconductor substrate 102 after lining the sidewalls 204 and the bottom 206 of the trenches 104 with a first insulating material 208. The first insulating material 208 may be formed by oxide deposition, thermal oxidation or a combination of both oxide deposition and thermal oxidation. However, other dielectric or combinations of dielectrics may be used. In one embodiment, the first insulating material 204 is a field oxide. The semiconductor mesas 110 are illustrated as dashed lines in FIG. 4A since the mesas 110 are covered by the first insulating material 208 in this view.

FIGS. 5A through 5C show the semiconductor substrate 102 after filling the trenches 104 with a first electrically conductive material 210. In one embodiment, the first electrically conductive material 210 is polysilicon. The polysilicon may be doped to the required resistivity. The thickness of the first electrically conductive material 210 depends on dimension 'a'. For example, the thickness of the first electrically conductive material 210 may be greater than a/2. Materials other than doped polysilicon may be used for the first electrically conductive material 210, and/or combinations of conductive materials which may use a combination of titanium nitride and polysilicon. The semiconductor mesas 110 are illustrated as dashed lines in FIG. 5A since the mesas 110 are covered by the electrically conductive material 210 in this view.

FIGS. 6A through 6C show the semiconductor substrate 102 after planarizing the first electrically conductive material 210. In one embodiment, the first electrically conductive material 210 is planarized by a CMP (chemical-mechanical polishing) process which stops on the first insulating material 204. The semiconductor mesas 110 are illustrated as dashed lines in FIG. 6A since the mesas 110 are covered by the first insulating material 204 in this view.

Figure 7B:
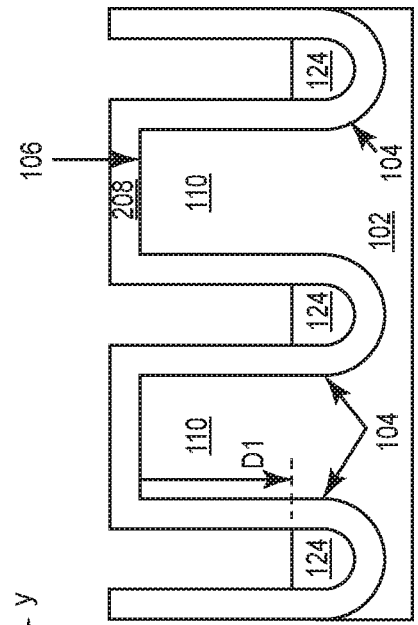
Figure 7C:
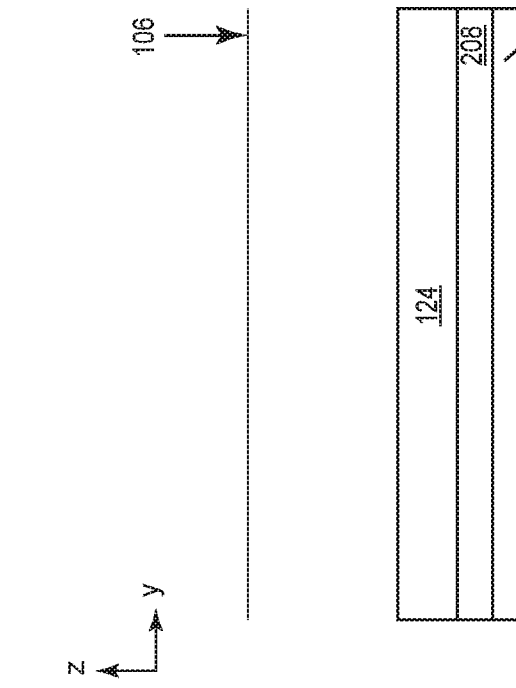
Figure 7A:
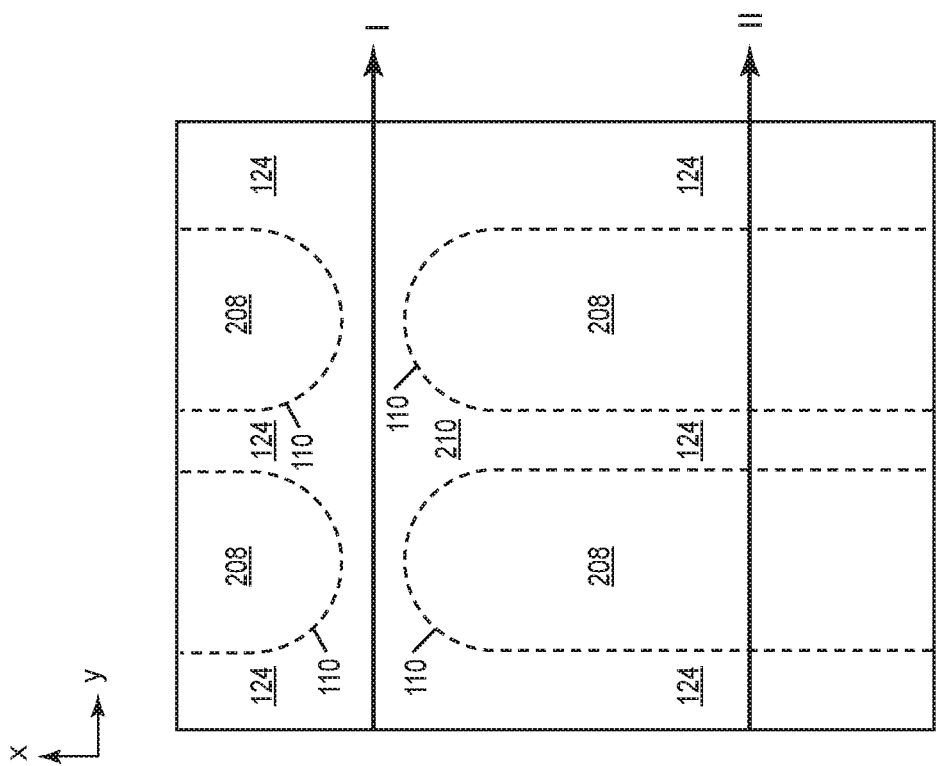

FIGS. 7A through 7C show the semiconductor substrate 102 after recessing the first electrically conductive material 210 to a first depth D1 in the trenches 104 to form the field electrodes 124. In one embodiment, the first electrically conductive material 210 is recessed by a timed etching process. The planarization shown in FIG. 6 and the recess etching shown in FIG. 7 may be done in one etching step.

Figure 8B:
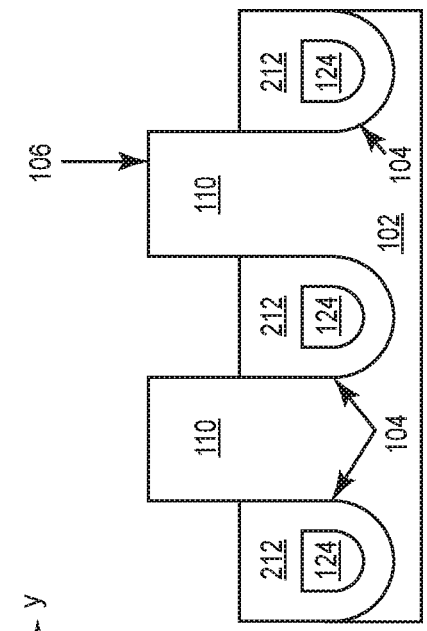
Figure 8C:
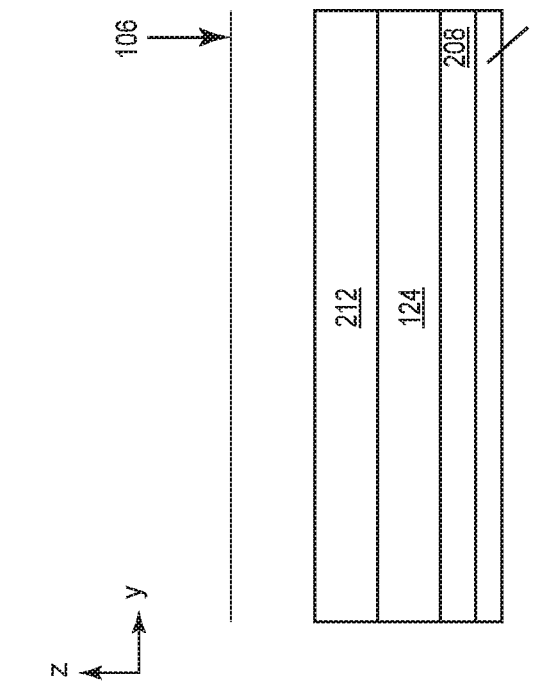
Figure 8A:
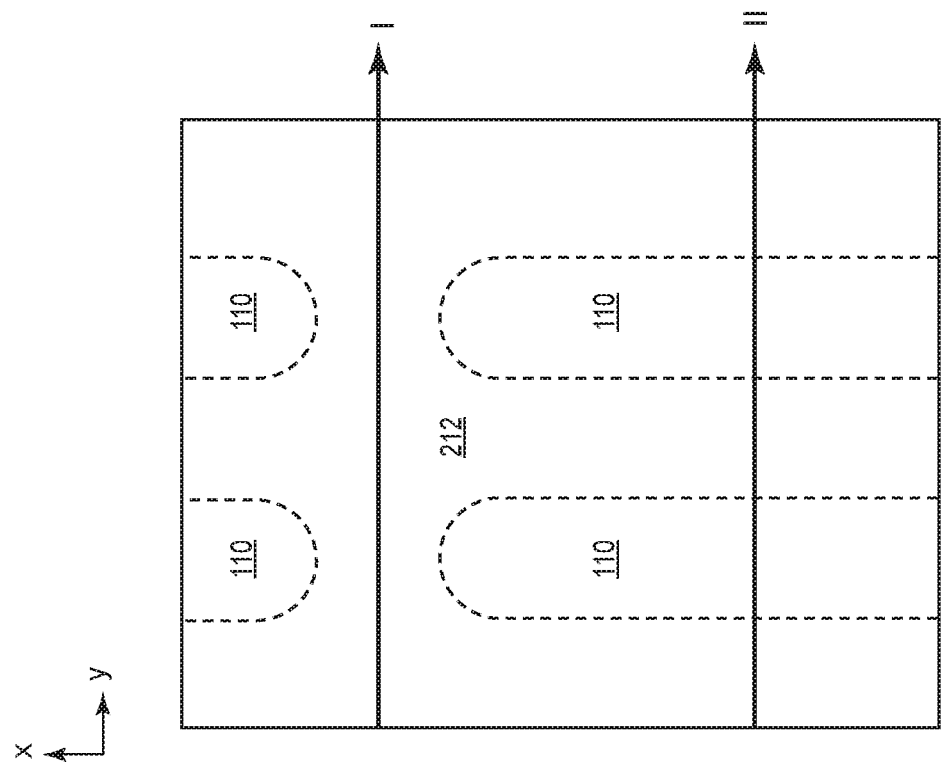
Figure 10D:
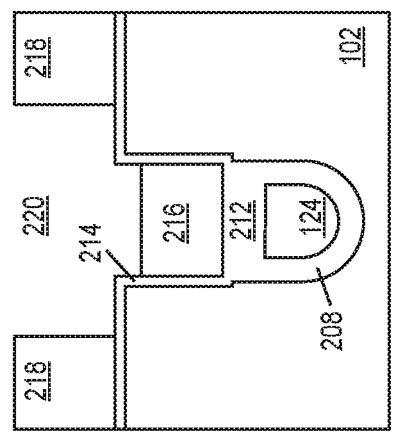

FIGS. 8A through 8C show the semiconductor substrate 102 after covering the field electrodes 123 with a second insulating material 212. The second insulating material 212 serves to dielectrically insulate each field electrode 124 from the gate electrode 116 to be formed over the field electrode 124. The second insulating material 212 may be formed by oxide deposition, thermal oxidation or a combination of both oxide deposition and thermal oxidation. For example, the second insulating material 212 may be formed by oxide deposition and a selective etch back, or thermal oxidation, or a combination of oxide deposition, selective etch back and thermal oxidation. Other deposited dielectrics with selective etch back may also be used. In one embodiment, the second insulating material 212 is an inter-poly dielectric (IPD).

FIGS. 9A through 9C show the semiconductor substrate 102 after recessing the second insulating material 212 into the trenches 104, forming a gate dielectric 214 on the exposed silicon mesas 110 and exposed sidewalls 204 of the trenches 104, and filling the trenches 104 with a second electrically conductive material 216. The gate dielectric 214 may be formed by thermal oxide growth, or oxide deposition, or other gate dielectric formation technique. The thickness of the second electrically conductive material 216 depends on dimension 'a' as in FIG. 5A. In one embodiment, the second electrically conductive material 216 is polysilicon. The second electrically conductive material 216 is recessed to a second depth D2 in the trenches 102 less than the first depth D1 to form the gate electrodes 116. The semiconductor mesas 110 are illustrated as dashed lines in FIG. 9A since the mesas 110 are covered by the gate dielectric 214 in this view. In one embodiment, the second insulating material 212 is formed as part of a thermal oxidation process used to grow the gate dielectric 214. According to this embodiment, the thermal oxidation process for growing the gate dielectric 214 would simultaneously grow the second insulating material 212.

FIGS. 10A through 10D show the semiconductor substrate 102 after forming a mask 218 on the second electrically conductive material 216. The mask 218 has openings 220 which define the trench connecting regions 108. The second electrically conductive material 216 is uncovered (exposed) by the openings 220 in the mask 218 which define the opening for connecting the first electrically conductive material 210 in the trench connecting regions 108. The gate dielectric 214 also may be uncovered by the openings 220 in the mask 218 which define the trench connecting regions 108. The gate electrodes 116 are covered (protected) by the mask 218 outside the trench connecting regions 108. In one embodiment, the mask 218 is a patterned photoresist. However, other types of masks may be used such as a hard mask like silicon nitride or silicon oxide. The semiconductor mesas 110 are illustrated as dashed lines in FIG. 10A since the mesas 110 are covered by the mask 218 and the gate dielectric 214 in this view.

Figure 11D:
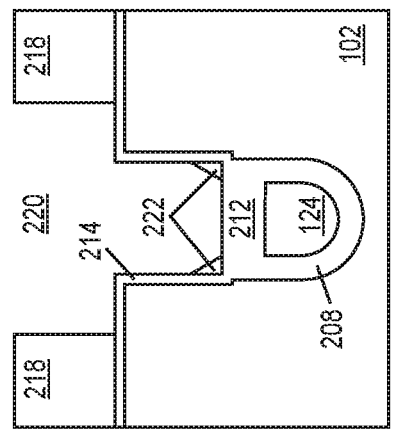
Figure 12B:
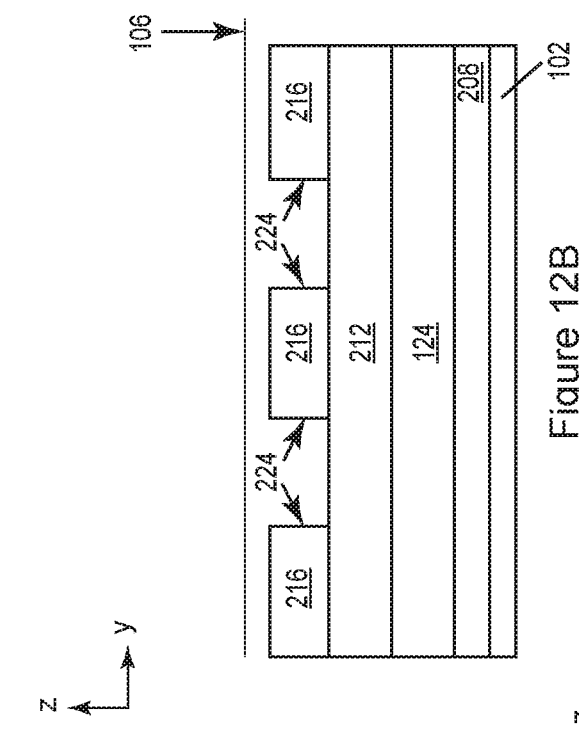
Figure 12C:
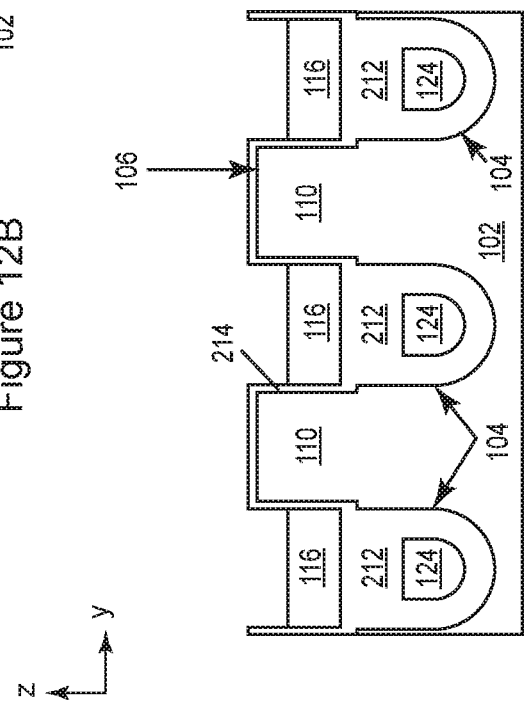
Figure 12A:
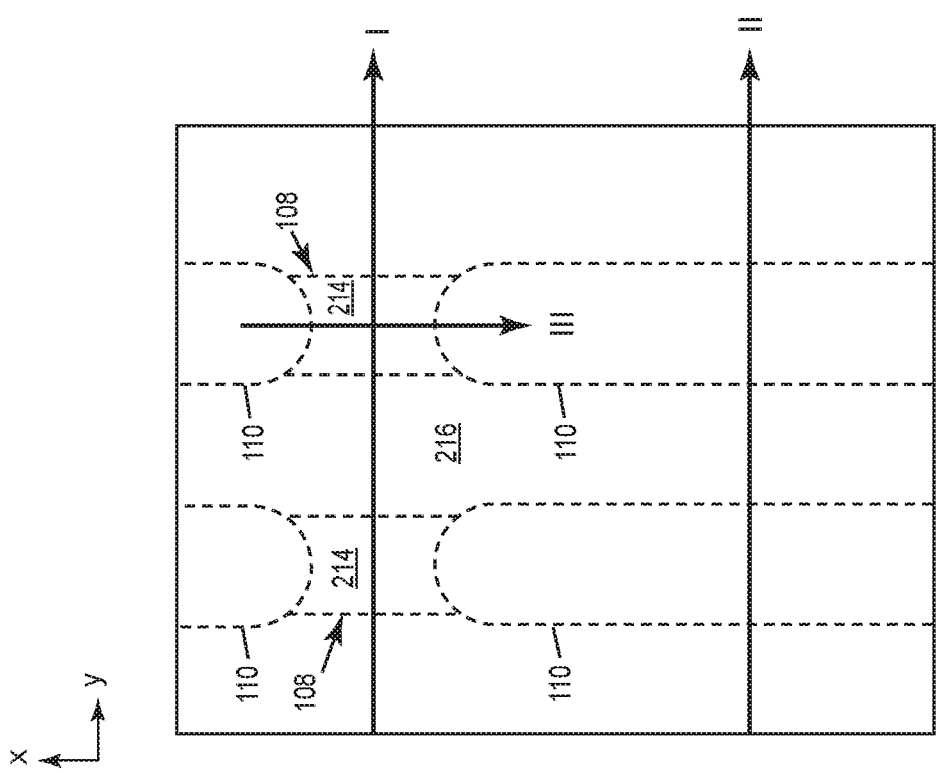
Figure 12D:
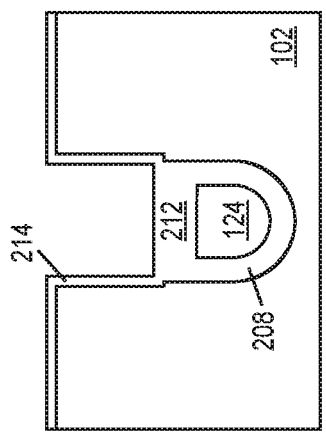
Figure 13B:
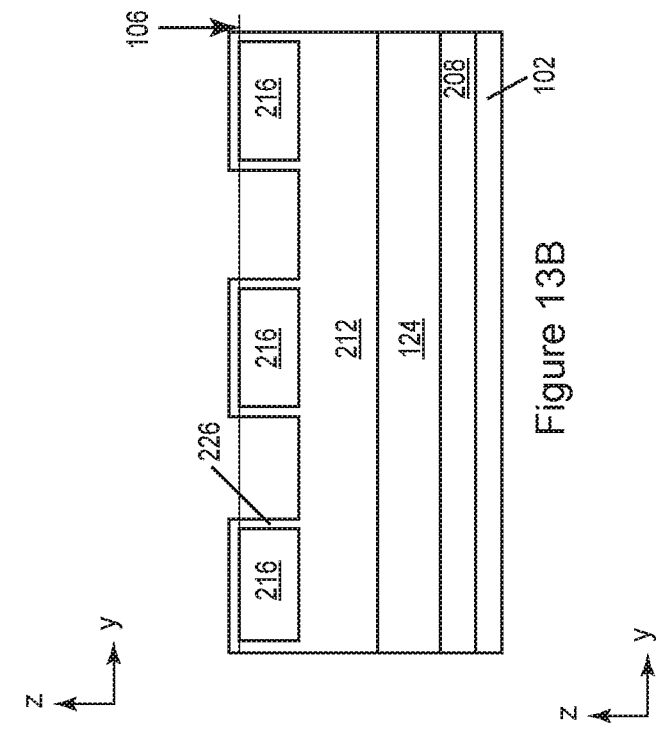
Figure 13C:
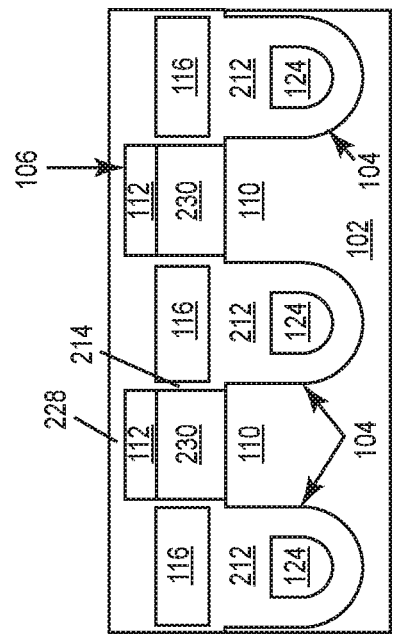
Figure 13A:
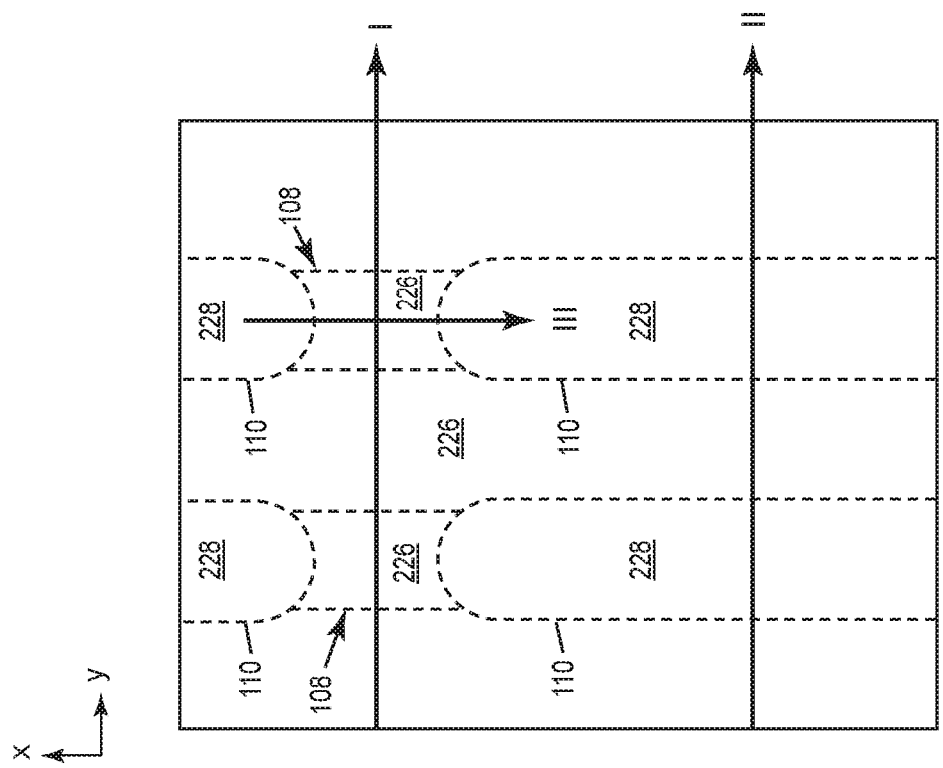
Figure 13D:
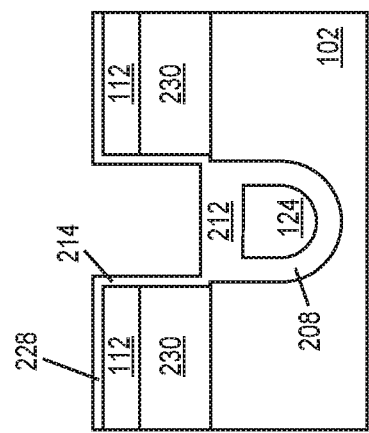
Figure 14B:
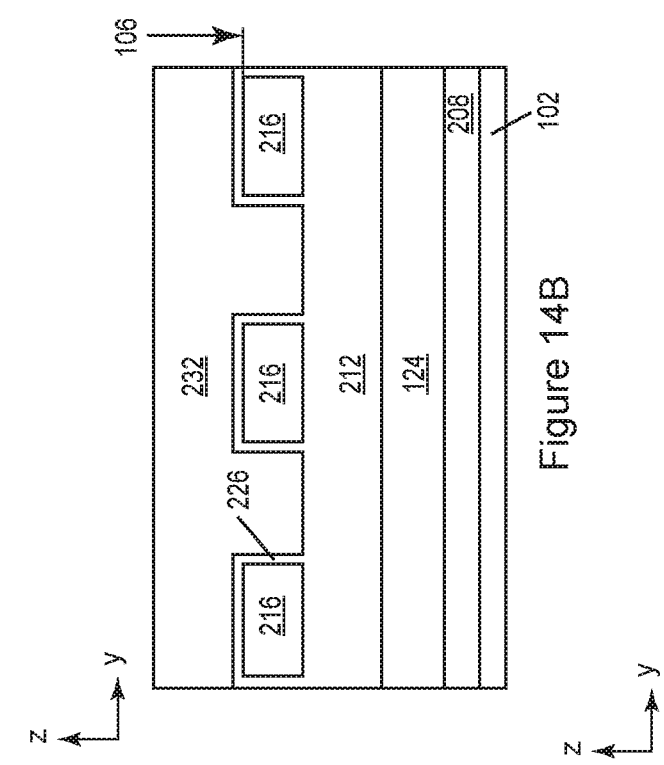
Figure 14C:
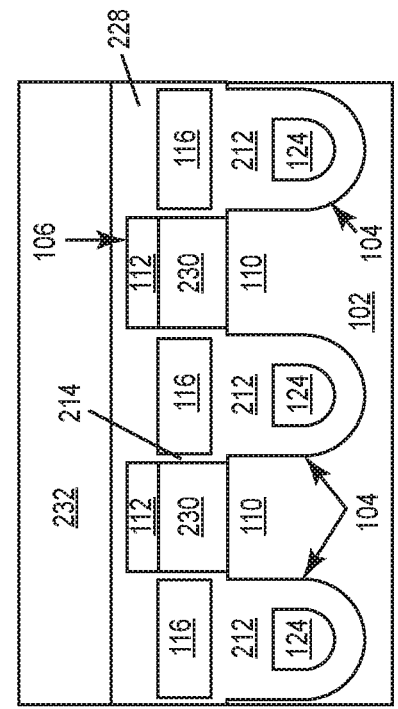
Figure 14A:
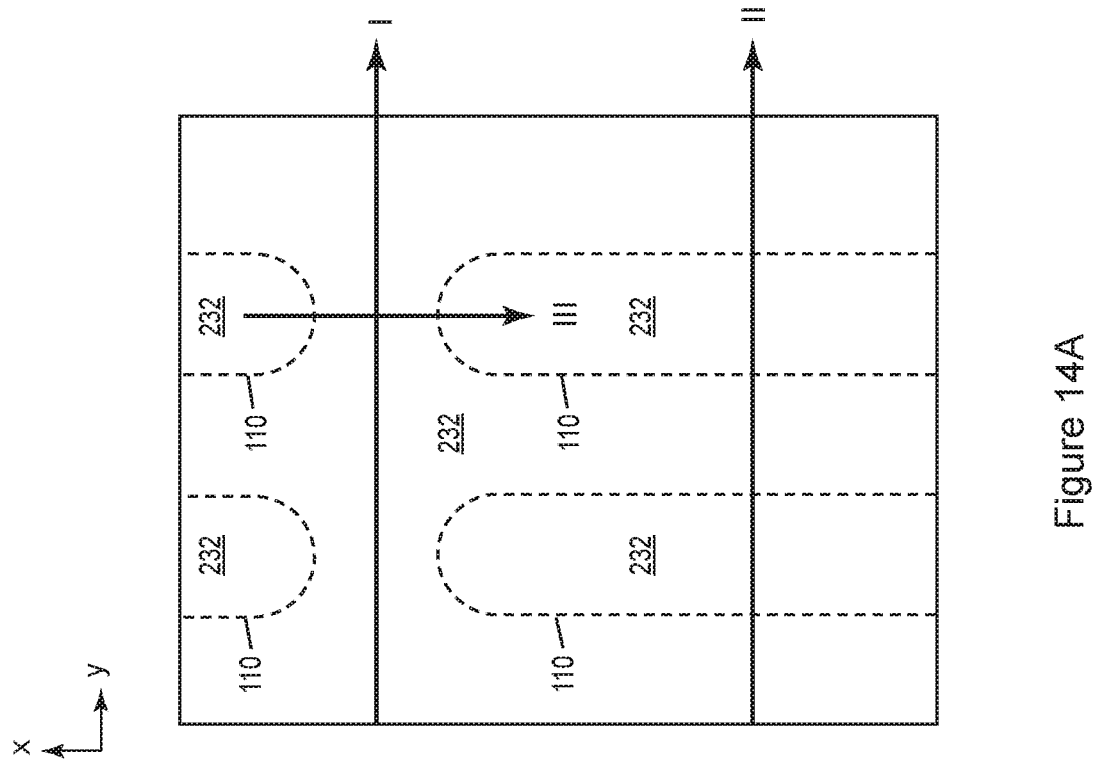
Figure 14D:
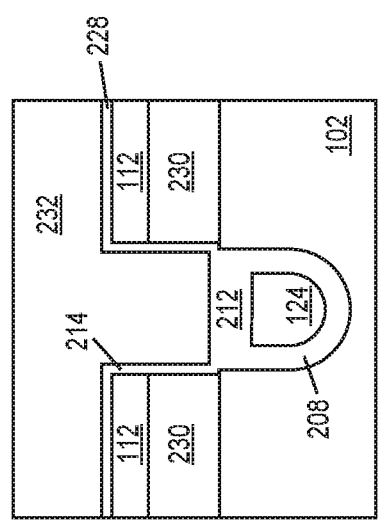
Figure 15B:
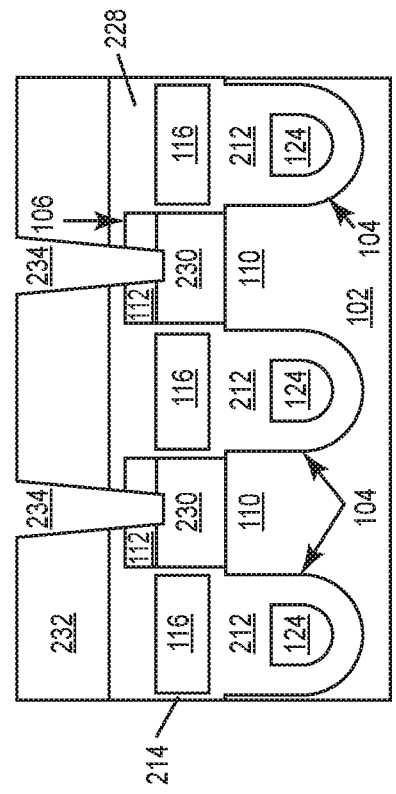
Figure 15C:
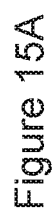
Figure 15A:
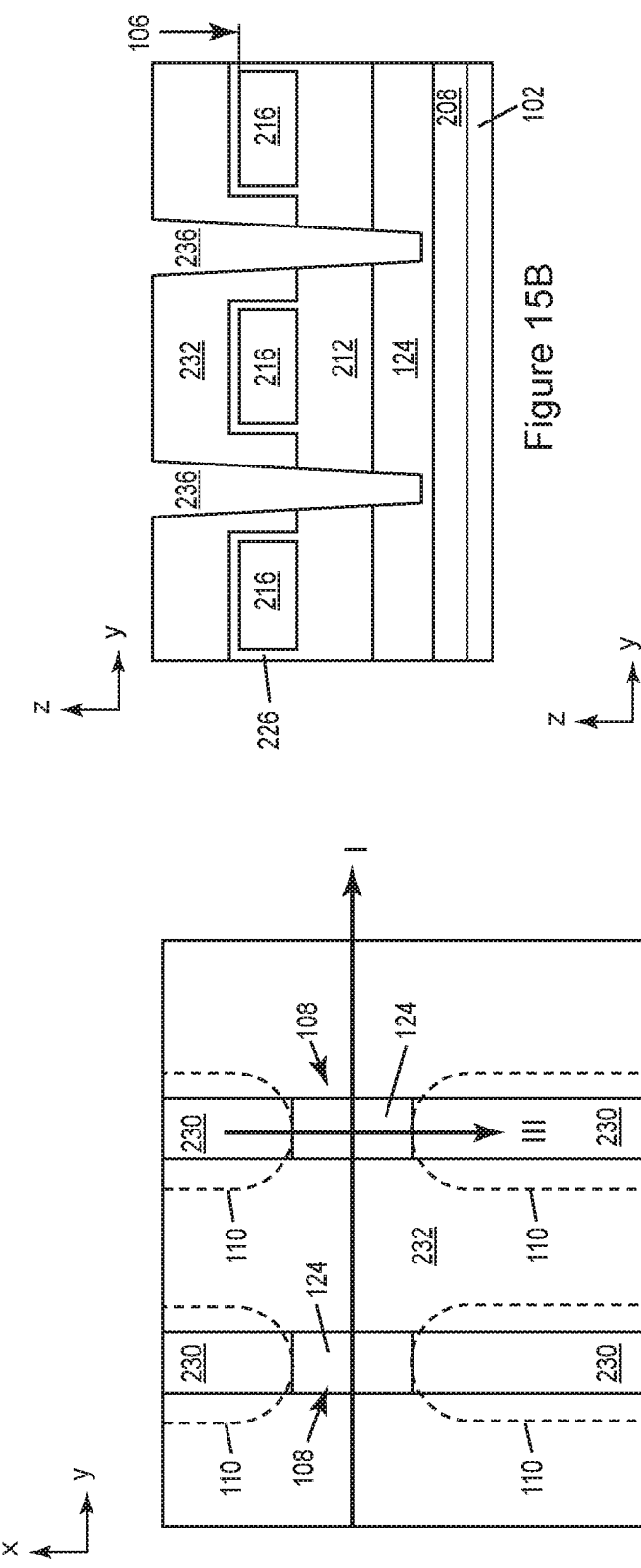
Figure 15D:
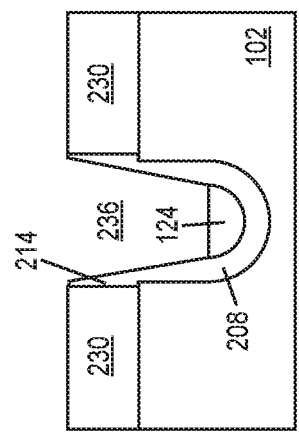
Figure 16D:
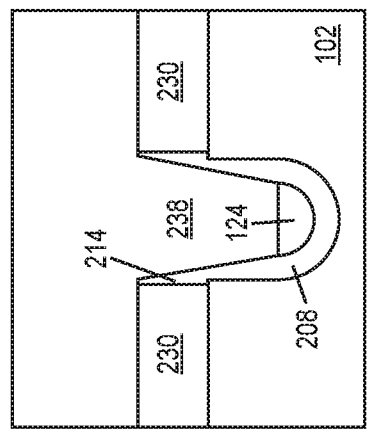
Figure 17B:
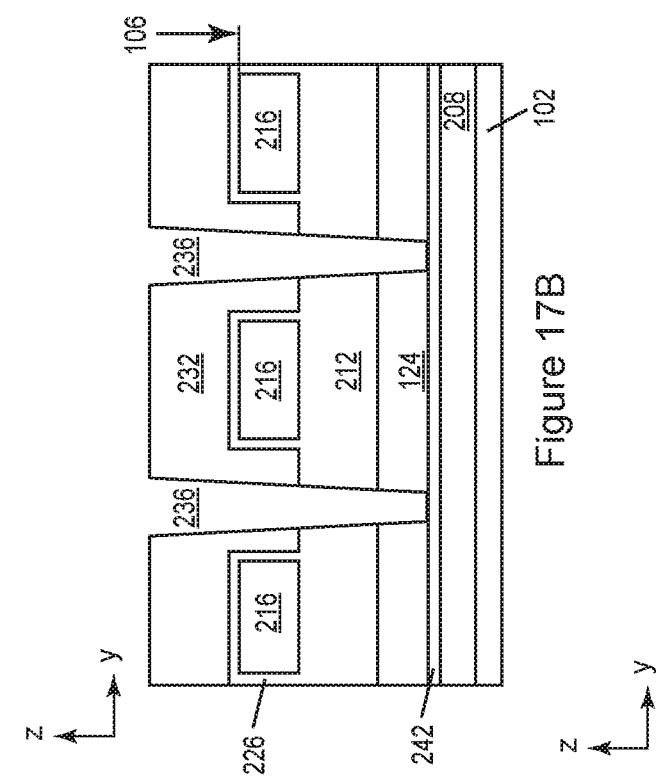
Figure 17C:
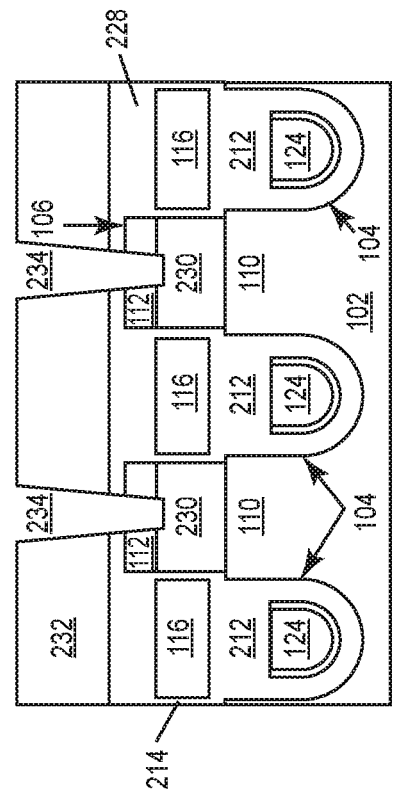
Figure 17A:
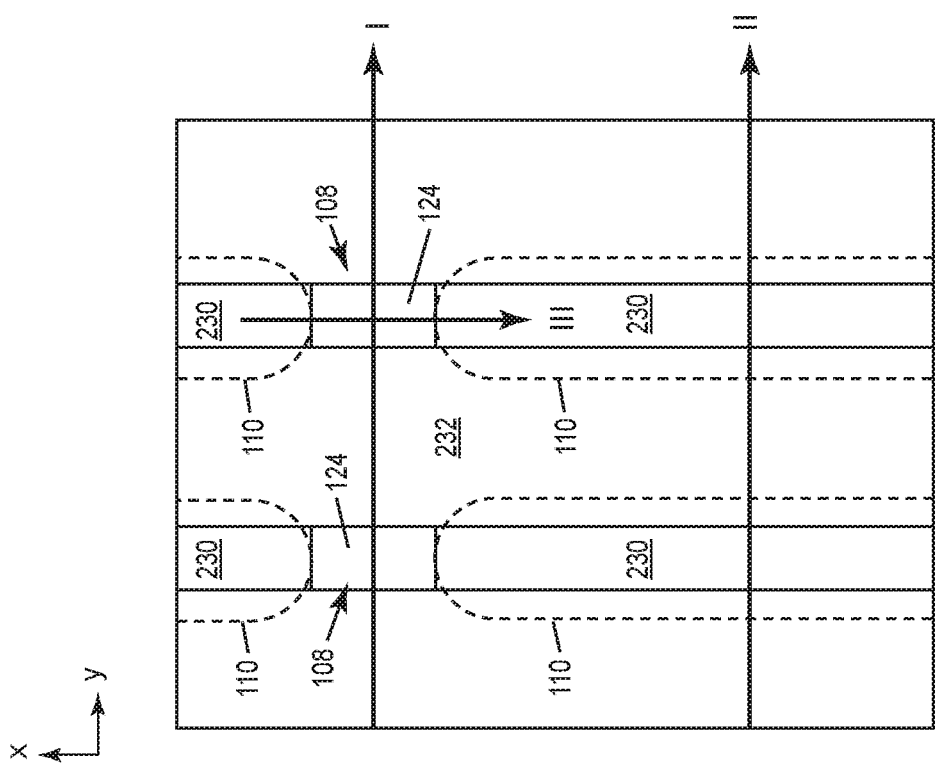
Figure 17D:
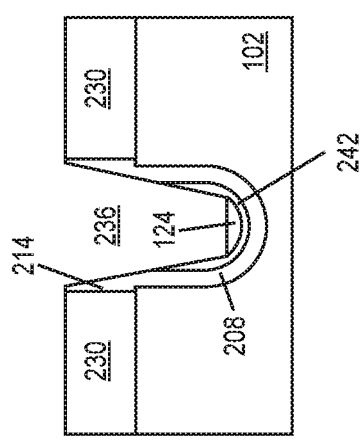

FIGS. 11A through 11D show the semiconductor substrate 102 after etching through the uncovered part of the second electrically conductive material 216 to expose the second insulating material 212 in the trench connecting regions 108. The gate electrodes 116 remain covered by the mask 218 outside the trench connecting regions 108 during the etching of the uncovered part of the second electrically conductive material 216. The etch process is selective to the dielectric materials of the gate 214 and second insulating material 212. In one embodiment, the uncovered part of the second electrically conductive material 216 is etched through in the trench connecting regions 108 by a predominantly anisotropic plasma etch. A predominantly anisotropic plasma etch means that the etch process may have an isotropic etch component that provides a degree of lateral undercut of the second electrically conductive material 216 in the trench connecting regions 108. As shown in FIG. 11D, an etch process that is exclusively anisotropic may result in a small polysilicon fillet 222 at the bottom corners of the trench connecting regions 108. By providing so some lateral undercut, the small polysilicon fillet 222 may be removed. The dashed ovals in FIG. 11B indicate the position of the lateral undercut.

The etch process shown in FIGS. 11A through 11D may balance a pure anisotropic etch with an isotropic etch component to remove the polysilicon fillet 222 from the bottom corners of the trench connecting regions 108. For example, the etch process may be implemented in two stages: an anisotropic etch followed and an isotropic etch. In another embodiment, the etch process is controlled to yield some degree of isotropy but so that the etch is mainly anisotropic. For example, the vertical power and/or gas composition of the etch process may be adjusted/balanced to control the amount of polymer generated during etching through the uncovered part of the second electrically conductive material 216 in the trench connecting regions 108. The semiconductor mesas 110 are illustrated as dashed lines in FIG. 11A since the mesas 110 are covered by the mask 218 and the gate dielectric 214 in this view.

FIGS. 12A through 12D show the semiconductor substrate 102 after removing the mask 218. In the case of a photoresist mask, the mask 218 may be removed by a photoresist chemical strip process. The semiconductor mesas 110 are illustrated as dashed lines in FIG. 12A since the mesas 110 are covered by the gate dielectric 214 in this view.

FIGS. 13A through 13D show the semiconductor substrate 102 after oxidizing sidewalls 224 of the second electrically conductive material 216 exposed by etching through the uncovered part of the second electrically conductive material 216 in the trench connecting regions 108. The resulting oxide 226 may also cover the exposed topside of the second electrically conductive material 216 in the trench connecting regions 108. The oxide 226 may be formed, e.g., by thermal oxidation. Any residual polysilicon fillets 222 at the bottom corners of the trench connecting regions 108 would be oxidized away by thermal oxidation.

The oxidizing of the exposed sidewalls 224 of the second electrically conductive material 216 in the trench connecting regions 108 may also further oxidize the top surface of the semiconductor mesas 110 which acts as a screen oxide 228 for implanting dopant species into the semiconductor mesas 110. For example, the screen oxide 228 may be about 10 nm thick or even thicker. Dopants are implanted through the oxidized surface 228 and into the semiconductor mesas 110 to form one or more transistor device regions. For example, dopants of the second conductivity type may be implanted through the oxidized surface 228 of the semiconductor mesas 110 to form the body regions 230 of the power transistor device 100. Dopants of the first conductivity type also may be implanted through the oxidized surface 228 of the semiconductor mesas 110 to form the source regions 112 of the power transistor device 100 above the body regions 230. The semiconductor mesas 110 are illustrated as dashed lines in FIG. 13A since the mesas 110 are covered by the screen oxide 228 in this view.

FIGS. 14A through 14D show the semiconductor substrate 102 after filling the space in the trench connecting regions 108 between adjacent oxidized sidewalls 224/226 of the second electrically conductive material 216 with a third insulating material 232. The third insulating material 232 may be formed by oxide deposition or a combination of oxide deposition followed by thermal oxidation. In one embodiment, the third insulating material 232 is an interlayer dielectric (ILD). The semiconductor mesas 110 are illustrated as dashed lines in FIG. 14A since the mesas 110 are covered by the third insulating material 232 in this view.

FIGS. 15A through 15D show the semiconductor substrate 102 after etching first contact openings 234 through the third insulating material 232, the oxidized surface 228 of the semiconductor mesas 110 and the source regions 112 and into the body regions 230 in the semiconductor mesas 110, and after etching second contact openings 236 through the third insulating material 232 and the second insulating material 212 and into the field electrodes 124 in the trench connecting regions 108. Etching of the second contact openings 236 may stop before the second contact openings 236 extend completely through the field electrodes 124 as indicated by the leftmost second contact opening 236 in FIG. 15B, or the etching may stop on the underlying first insulating material 208 such that the second contact openings 236 extend completely through the field electrodes 124 as indicated by the rightmost second contact opening 236 in FIG. 15B. After the contact etching, an implant of the same dopant type as the body region 230 may be performed to lower contact resistance to the body region 230.-*/

The first and second contact openings 234, 236 may be etched concurrently or sequentially. In the case of silicon as the material of the semiconductor mesas 110, an anisotropic oxide etch selective to silicon may be used to etch the first contact openings 234 through the source regions 112 and into the body regions 230 in the semiconductor mesas 110. The oxide etch goes through more oxide in the trench connecting regions 108 than in the source contact regions. In one embodiment, a 2-step etch process is used. In a first step, an oxide etch is performed to expose the field electrodes 124 in the trench connecting regions 108 and to expose the source regions 112 in the semiconductor mesas 110. In a second step, a contact etch is performed to remove semiconductor material from the semiconductor mesas 110 and to remove field electrode material from the field electrodes 124 in the trench connecting regions 108, thereby forming the respective first and second contact openings 234, 236. Any standard contact lithography and etching processes may be used to form the first and second contact openings 234, 236. The semiconductor mesas 110 are partly illustrated as dashed lines in FIG. 15A where covered by the third insulating material 232.

FIGS. 16A through 16D show the semiconductor substrate 102 filling the second contact openings 236 with a third electrically conductive material 238 and filling the first contact openings 234 with a fourth electrically conductive material 240. In one embodiment, the first and second contact openings 234, 236 are etched concurrently using a same etch process and the first and second contact openings 234, 236 are filled concurrently such that the third electrically conductive 238 and the fourth electrically conductive 240 are the same material such as a metal or metal alloy. The electrically conductive material 238, 240 filling the contact openings 234, 236 may be planarized, e.g., by CMP. The semiconductor mesas 110 are partly illustrated as dashed lines in FIG. 16A where covered by the third insulating material 232.

FIGS. 17A through 17D illustrate a variant according to which after lining the sidewalls and the bottom of the trenches 104 with the first insulating material 208 and before filling the trenches 104 with the first electrically conductive material 210, the method includes forming an electrically conductive liner 242 on the first insulating material 208. According to this variant, etching of the second contact openings 236 stops at the electrically conductive liner 242 below the field electrodes 124. In one embodiment, the field electrodes 124 comprise polysilicon and the electrically conductive liner 242 comprises TiN. If the field electrodes 124 are etched all the way through in the trench connecting regions 108, the etching stops on the underlying first insulating material 208 and the electrical contact to the field electrodes 124 would be at just the sidewalls of the field electrodes 124. By providing the electrically conductive liner 242 on the first insulating material 208, the etching stops on the liner 242 which yields improved electrical contact.

FIGS. 18A to 23D illustrate additional embodiments according to which the field electrode connection is brought to the first main surface 106 of the semiconductor substrate 102.

Figure 18B:
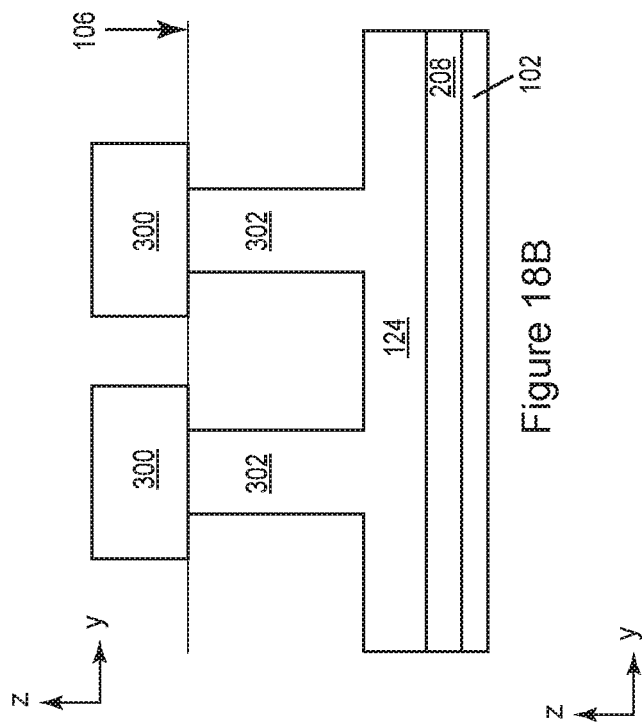
Figure 18C:
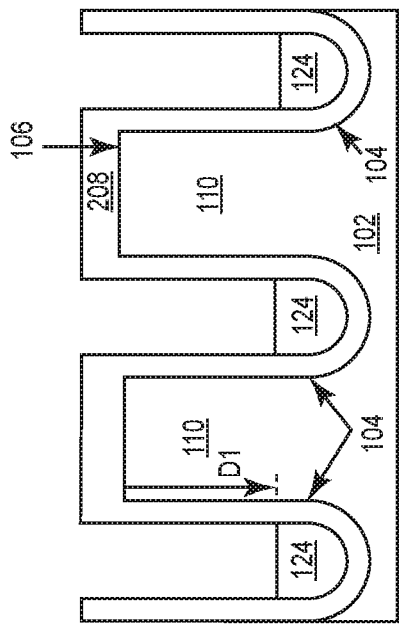
Figure 18A:
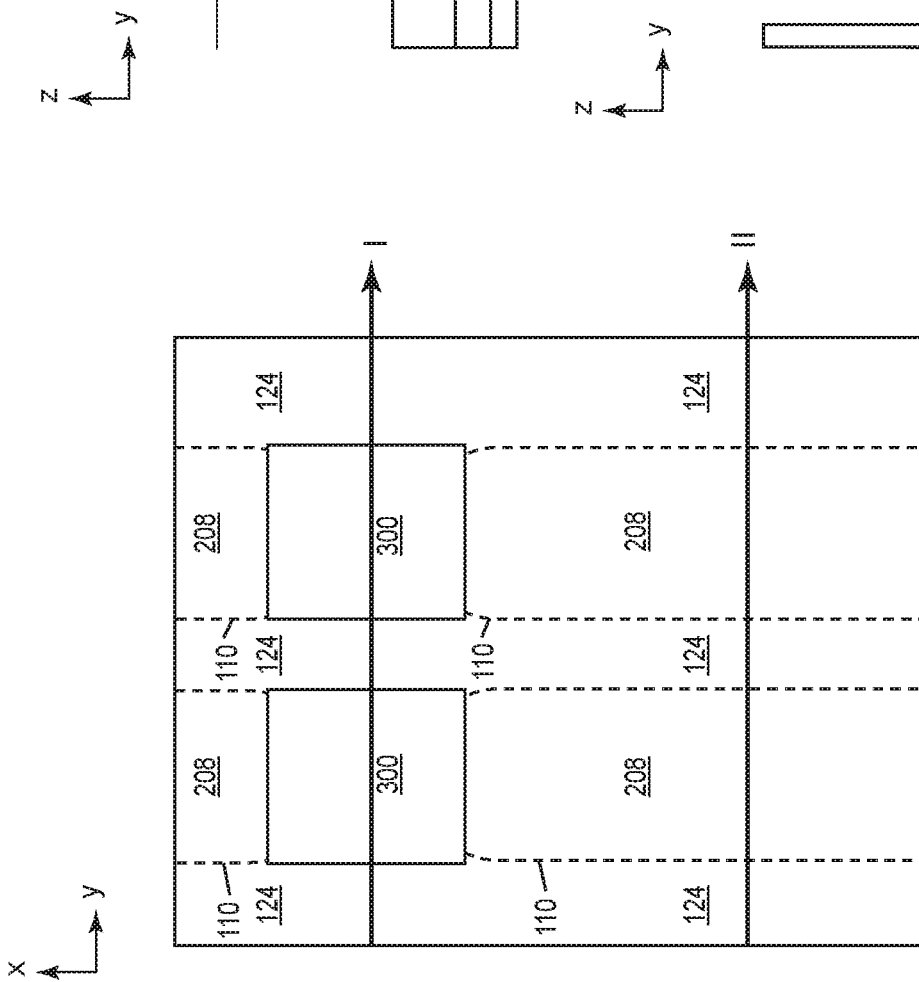

FIGS. 18A to 18C picks up after the planarization process shown in FIGS. 6A to 6O, and include forming a patterned photoresist 300 over the first main surface 106 of the semiconductor substrate 102 and etching the exposed part of the first electrically conductive material 210. According to this embodiment, the etching yields the field electrodes 124 and corresponding vertical extensions 302 for providing a field electrode contact region at the first main surface 106 of the semiconductor substrate 102.

Figure 19B:
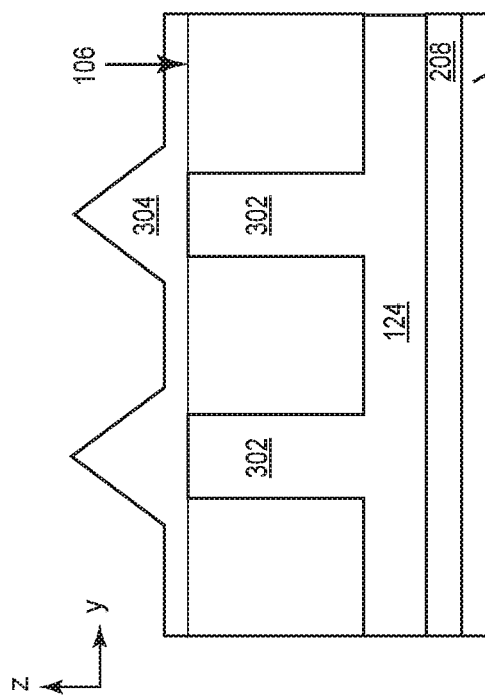
Figure 19C:
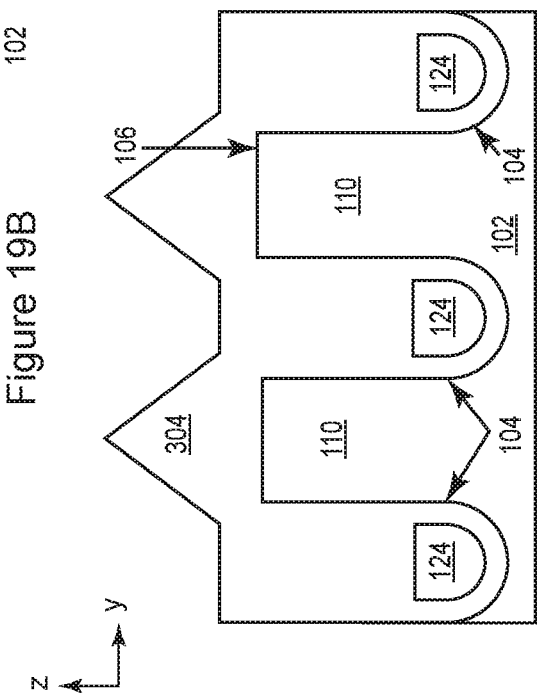
Figure 19A:
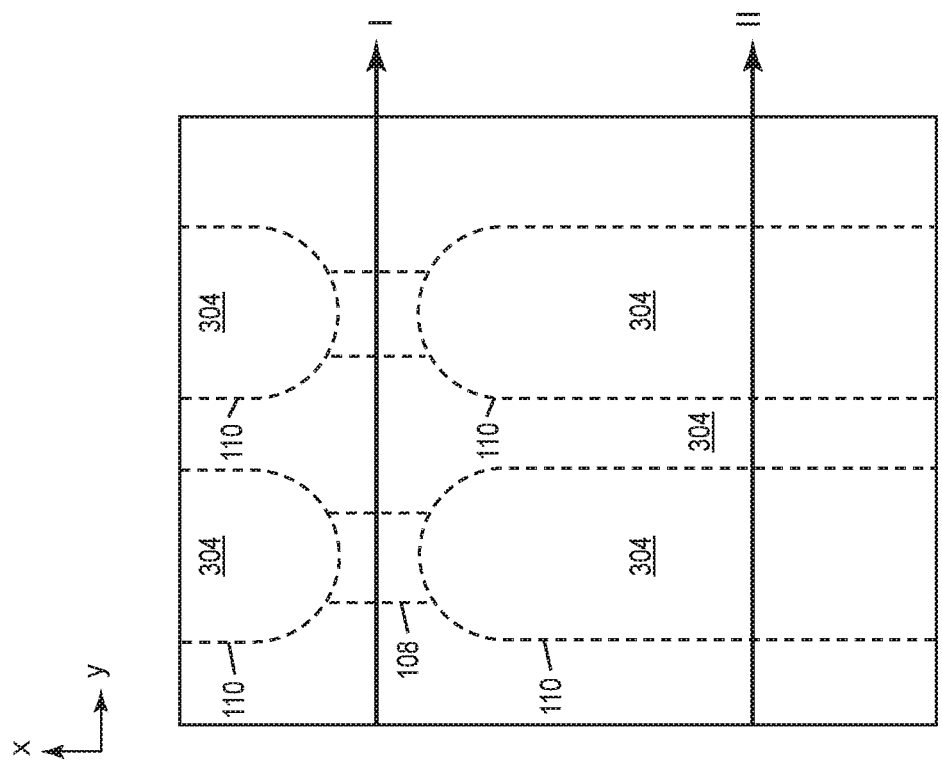

FIGS. 19A through 19C show the semiconductor substrate 102 after an oxide deposition process such as a high-density plasma (HDP) oxide process. The oxide deposition process forms an oxide layer 304 over the first main surface 106 of the semiconductor substrate 102.

FIGS. 20A through 20C show the semiconductor substrate 102 after planarization of the oxide layer 304, e.g., by CMP and after patterned etching of the oxide layer 304 to form second insulating material 212. The planarization process removes the oxide layer 304 from the top/front surface 306 of the vertical field electrode extensions 302. The patterned etching of the oxide layer 304 may include forming a patterned photoresist 308 on the exposed top/front surface 306 of the vertical field electrode extensions 302 and the etching into the exposed part of the oxide layer 304, e.g., using a timed etching process to form the second insulating material 212.

FIGS. 21A through 21D show the semiconductor substrate 102 after formation of the gate dielectric 214, deposition of the second electrically conductive material 216, planarization of the second electrically conductive material 216, and recessing of the planarized second electrically conductive material 216 to form the gate electrodes 116. In one embodiment, the second insulating material 212 is formed as part of a thermal oxidation process used to grow the gate dielectric 214. According to this embodiment, the thermal oxidation process for growing the gate dielectric 214 would simultaneously grow the second insulating material 212. Such a thermal oxidation process would rely on a higher oxidation rate of phosphorus-doped polysilicon which may be used to simplify the process. This approach may be used as an alternative to depositing a thick HDP oxide layer 304 and therefore avoids the CMP and etch back processing of the thick HDP oxide layer 304 shown in FIGS. 20A through 20C.

FIGS. 22A through 22D show the semiconductor substrate 102 after formation of the third insulating material 232.

Figure 23D:
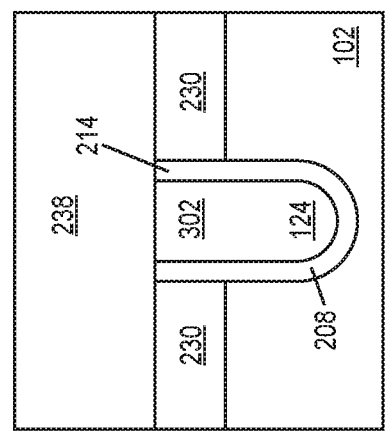

FIGS. 23A through 23D show the semiconductor substrate 102 after formation of the field electrode contacts 238 and the source/body contacts 240. Different from the embodiment shown in FIGS. 16A to 16D, the field electrodes 124 have a vertical extension 302 which extends to the first main surface 106 of the semiconductor substrate 102. The field electrode contacts 238 may extend into the field electrode vertical extensions 302 as shown in FIG. 23B or terminate coplanar with the top/front surface 306 of the vertical field electrode extensions 302.

The embodiments described herein provide for a semiconductor device having a plurality of trenches formed in a semiconductor substrate and extending lengthwise in parallel with one another. The trenches have connecting regions which interconnect adjacent ones of the trenches. Semiconductor mesas are separated from one another by the trenches in a first lateral direction and by the connecting regions in a second lateral direction transverse to the first lateral direction. A gate electrode and a field electrode below the gate electrode are provided in at least some of the trenches, and dielectrically insulated from each other and from the semiconductor substrate. The gate electrodes and the field electrodes are contacted separately and independently such that the gate electrodes are uninterrupted over the length of the trenches. Such a semiconductor device allows field electrode connections to be made without interrupting the gate electrodes and therefore without the need to add a gate bus, allowing for tuning of gate resistance and field electrode resistance (e.g. for snubbers) without compromising $RDS_{ON}$.

Although the present disclosure is not so limited, the following numbered examples demonstrate one or more aspects of the disclosure.

Example 1. A semiconductor device, comprising: a semiconductor substrate; a plurality of trenches formed in the semiconductor substrate and extending lengthwise in parallel with one another, the plurality of trenches having connecting regions which interconnect adjacent ones of the trenches; semiconductor mesas separated from one another by the plurality of trenches in a first lateral direction and by the connecting regions in a second lateral direction transverse to the first lateral direction; a gate electrode and a field electrode below the gate electrode in at least some of the trenches, and dielectrically insulated from each other and from the semiconductor substrate; first contacts vertically extending into one or more transistor device regions in the semiconductor mesas; and second contacts vertically extending into the field electrodes in the connecting regions such that the gate electrodes are uninterrupted by the second contacts.

Example 2. The semiconductor device of example 1, wherein the one or more transistor device regions into which the first contacts vertically extend include a source region of a first conductivity type and a body region of a second conductivity type, and wherein the first contacts vertically extend through the source region and into the body region in the semiconductor mesas.

Example 3. The semiconductor device of example 1 or 2, wherein the second contacts terminate before reaching a bottom of the field electrodes into which the second contacts vertically extend.

Example 4. The semiconductor device of any of examples 1 through 3, further comprising a liner interposed between the field electrodes and one or more layers of insulating material that dielectrically insulates the field electrodes from the semiconductor substrate, and wherein the second contacts are in electrical contact with the liner below the field electrodes into which the second contacts vertically extend.

Example 5. The semiconductor device of example 4, wherein the liner comprises TiN.

Example 6. The semiconductor device of any of examples 1 through 5, wherein sidewalls of the gate electrodes are oxidized in a region adjoining the connecting regions, and wherein an insulating material is disposed in a space in the connecting regions between adjacent ones of the gate electrodes.

Example 7. The semiconductor device of example 6, wherein the second contacts vertically extend into the field electrodes in the connecting regions through openings in the insulating material disposed in the space in the connecting regions between the adjacent ones of the gate electrodes.

Example 8. The semiconductor device of example 6 or 7, wherein in the connecting regions, an additional insulating material is vertically interposed between the field electrodes and the insulating material disposed in the space in the connecting regions between the adjacent ones of the gate electrodes.

Example 9. A method of producing a semiconductor device, the method comprising: forming a plurality of trenches in a semiconductor substrate and which extend lengthwise in parallel with one another, wherein the plurality of trenches have connecting regions which interconnect adjacent ones of the trenches, wherein semiconductor mesas are separated from one another by the plurality of trenches in a first lateral direction and by the connecting regions in a second lateral direction transverse to the first lateral direction; forming a gate electrode and a field electrode below the gate electrode in at least some of the trenches, and dielectrically insulated from each other and from the semiconductor substrate; forming first contacts which vertically extend into one or more transistor device regions in the semiconductor mesas; and forming second contacts which vertically extend into the field electrodes in the connecting regions such that the gate electrodes are uninterrupted by the second contacts.

Example 10. The method of example 9, wherein forming the plurality of trenches comprises: forming a mask on a first main surface of the semiconductor substrate and which defines a location of the semiconductor mesas, the mask having regions which are separated from one another in the first lateral direction and in the second lateral direction; and etching the plurality of trenches into an unmasked part of the first main surface of the semiconductor substrate.

Example 11. The method of example 9 or 10, wherein forming the gate electrode and the field electrode below the gate electrode in at least some of the trenches comprises: lining sidewalls and a bottom of the trenches with a first insulating material; after lining the sidewalls and the bottom of the trenches with the first insulating material, filling the trenches with a first electrically conductive material; recessing the first electrically conductive material to a first depth in the trenches to form the field electrodes; covering the field electrodes with a second insulating material; after covering the field electrodes with the second insulating material, recessing the second insulating material, forming a gate dielectric on the exposed silicon mesa and trench sidewall, and filling the trenches with a second electrically conductive material; and recessing the second electrically conductive material to a second depth in the trenches less than the first depth to form the gate electrodes.

Example 12. The method of example 11, wherein forming the second contacts comprises: forming a mask on the second electrically conductive material such that the gate electrodes are covered by the mask outside the connecting regions of the trenches and the second electrically conductive material is uncovered by the mask in the connecting regions; while the gate electrodes are covered by the mask outside the connecting regions of the trenches, etching through the uncovered part of the second electrically conductive material to expose the second insulating material in the connecting regions; oxidizing sidewalls of the second electrically conductive material exposed by etching through the uncovered part of the second electrically conductive material in the connecting regions of the trenches; filling a space in the connecting regions between adjacent oxidized sidewalls of the electrically conductive material with a third insulating material; etching second contact openings through the third insulating material and the second insulating material and into the field electrodes in the connecting regions of the trenches; and filling the second contact openings with a third electrically conductive material Example 13. The method of example 12, wherein the third insulating material covers the semiconductor mesas, wherein the oxidizing of the exposed sidewalls of the second electrically conductive material also oxidizes a surface of the semiconductor mesas, and wherein forming the first contacts comprises: etching first contact openings through the third insulating material and the oxidized surface of the semiconductor mesas and into the one or more transistor device regions in the semiconductor mesas; and filling the first contact openings with a fourth electrically conductive material.

Example 14. The method of example 13, wherein the first contact openings and the second contact openings are etched concurrently using a same etch process, and wherein the first contact openings and the second contact openings are filled concurrently such that the third electrically conductive material and the fourth electrically conductive material are the same material.

Example 15. The method of example 13 or 14, further comprising: before forming the third insulating material, implanting dopants through the oxidized surface and into the semiconductor mesas to form the one or more transistor device regions.

Example 16. The method of any of examples 12 through 15, wherein the etching of the second contact openings stops before the second contact openings extend completely through the field electrodes.

Example 17. The method of any of examples 12 through 15, wherein the etching of the second contact openings stops at the first insulating material below the field electrodes.

Example 18. The method of any of examples 12 through 17, further comprising: after lining the sidewalls and the bottom of the trenches with the first insulating material and before filling the trenches with the first electrically conductive material, forming an electrically conductive liner on the first insulating material.

Example 19. The method of example 18, wherein the etching of the second contact openings stops at the electrically conductive liner below the field electrodes.

Example 20. The method of any of examples 12 through 19, wherein the etching through the uncovered part of the second electrically conductive material in the connecting regions comprises a predominantly anisotropic plasma etch having an isotropic etch component that provides a degree of lateral undercut of the second electrically conductive material in the connecting regions.

Example 21. The method of any of examples 9 through 20, wherein each gate electrode and field electrode disposed in the same trench are dielectrically insulated from each other by an insulating material, wherein the gate electrode is dielectrically insulated from the semiconductor substrate by a gate dielectric, and wherein the insulating material and the gate dielectric are formed by a same thermal oxidation process.

Example 22. A semiconductor device, comprising: a semiconductor substrate; a plurality of trenches formed in the semiconductor substrate and extending lengthwise in parallel with one another, the plurality of trenches having connecting regions which interconnect adjacent ones of the trenches; semiconductor mesas separated from one another by the plurality of trenches in a first lateral direction and by the connecting regions in a second lateral direction transverse to the first lateral direction; and a gate electrode and a field electrode below the gate electrode in at least some of the trenches, and dielectrically insulated from each other and from the semiconductor substrate, wherein the gate electrodes and the field electrodes are contacted separately and independently such that the gate electrodes are uninterrupted over the length of the trenches.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate;
    a plurality of trenches formed in the semiconductor substrate and extending lengthwise in parallel with one another, the plurality of trenches having connecting regions which interconnect adjacent ones of the trenches;
    semiconductor mesas separated from one another by the plurality of trenches in a first lateral direction and by the connecting regions in a second lateral direction transverse to the first lateral direction;
    a gate electrode and a field electrode below the gate electrode in at least some of the trenches, and dielectrically insulated from each other and from the semiconductor substrate;
    first contacts vertically extending into one or more transistor device regions in the semiconductor mesas; and
    second contacts vertically extending into the field electrodes in the connecting regions such that the gate electrodes are uninterrupted by the second contacts.

2. The semiconductor device of claim 1, wherein the one or more transistor device regions into which the first contacts vertically extend include a source region of a first conductivity type and a body region of a second conductivity type, and wherein the first contacts vertically extend through the source region and into the body region in the semiconductor mesas.

3. The semiconductor device of claim 1, wherein the second contacts terminate before reaching a bottom of the field electrodes into which the second contacts vertically extend.

4. The semiconductor device of claim 1, further comprising a liner interposed between the field electrodes and one or more layers of insulating material that dielectrically insulates the field electrodes from the semiconductor substrate, and wherein the second contacts are in electrical contact with the liner below the field electrodes into which the second contacts vertically extend.

5. The semiconductor device of claim 4, wherein the liner comprises TiN.

6. The semiconductor device of claim 1, wherein sidewalls of the gate electrodes are oxidized in a region adjoining the connecting regions, and wherein an insulating material is disposed in a space in the connecting regions between adjacent ones of the gate electrodes.

7. The semiconductor device of claim 6, wherein the second contacts vertically extend into the field electrodes in the connecting regions through openings in the insulating material disposed in the space in the connecting regions between the adjacent ones of the gate electrodes.

8. The semiconductor device of claim 6, wherein in the connecting regions, an additional insulating material is vertically interposed between the field electrodes and the insulating material disposed in the space in the connecting regions between the adjacent ones of the gate electrodes.

9. A method of producing a semiconductor device, the method comprising:
    forming a plurality of trenches in a semiconductor substrate and which extend lengthwise in parallel with one another, wherein the plurality of trenches have connecting regions which interconnect adjacent ones of the trenches, wherein semiconductor mesas are separated from one another by the plurality of trenches in a first lateral direction and by the connecting regions in a second lateral direction transverse to the first lateral direction;
    forming a gate electrode and a field electrode below the gate electrode in at least some of the trenches, and dielectrically insulated from each other and from the semiconductor substrate;
    forming first contacts which vertically extend into one or more transistor device regions in the semiconductor mesas; and
    forming second contacts which vertically extend into the field electrodes in the connecting regions such that the gate electrodes are uninterrupted by the second contacts.

10. The method of claim 9, wherein forming the plurality of trenches comprises:
    forming a mask on a first main surface of the semiconductor substrate and which defines a location of the semiconductor mesas, the mask having regions which are separated from one another in the first lateral direction and in the second lateral direction; and
    etching the plurality of trenches into an unmasked part of the first main surface of the semiconductor substrate.

11. The method of claim 9, wherein forming the gate electrode and the field electrode below the gate electrode in at least some of the trenches comprises:
    lining sidewalls and a bottom of the trenches with a first insulating material;
    after lining the sidewalls and the bottom of the trenches with the first insulating material, filling the trenches with a first electrically conductive material;
    recessing the first electrically conductive material to a first depth in the trenches to form the field electrodes;
    covering the field electrodes with a second insulating material;
    after covering the field electrodes with the second insulating material, recessing the second insulating material, forming a gate dielectric on the exposed silicon mesa and trench sidewall, and filling the trenches with a second electrically conductive material; and
    recessing the second electrically conductive material to a second depth in the trenches less than the first depth to form the gate electrodes.

12. The method of claim 11, wherein forming the second contacts comprises:
    forming a mask on the second electrically conductive material such that the gate electrodes are covered by the mask outside the connecting regions of the trenches and the second electrically conductive material is uncovered by the mask in the connecting regions;
    while the gate electrodes are covered by the mask outside the connecting regions of the trenches, etching through the uncovered part of the second electrically conductive material to expose the second insulating material in the connecting regions;

oxidizing sidewalls of the second electrically conductive material exposed by etching through the uncovered part of the second electrically conductive material in the connecting regions of the trenches;

filling a space in the connecting regions between adjacent oxidized sidewalls of the second electrically conductive material with a third insulating material;

etching second contact openings through the third insulating material and the second insulating material and into the field electrodes in the connecting regions of the trenches; and filling the second contact openings with a third electrically conductive material.

13. The method of claim 12, wherein the third insulating material covers the semiconductor mesas, wherein the oxidizing of the exposed sidewalls of the second electrically conductive material also oxidizes a surface of the semiconductor mesas, and wherein forming the first contacts comprises:

etching first contact openings through the third insulating material and the oxidized surface of the semiconductor mesas and into the one or more transistor device regions in the semiconductor mesas; and filling the first contact openings with a fourth electrically conductive material.

14. The method of claim 13, wherein the first contact openings and the second contact openings are etched concurrently using a same etch process, and wherein the first contact openings and the second contact openings are filled concurrently such that the third electrically conductive material and the fourth electrically conductive material are the same material.

15. The method of claim 13, further comprising:

before forming the third insulating material, implanting dopants through the oxidized surface and into the semiconductor mesas to form the one or more transistor device regions.

16. The method of claim 12, wherein the etching of the second contact openings stops before the second contact openings extend completely through the field electrodes.

17. The method of claim 12, wherein the etching of the second contact openings stops at the first insulating material below the field electrodes.

18. The method of claim 12, further comprising:

after lining the sidewalls and the bottom of the trenches with the first insulating material and before filling the trenches with the first electrically conductive material, forming an electrically conductive liner on the first insulating material.

19. The method of claim 18, wherein the etching of the second contact openings stops at the electrically conductive liner below the field electrodes.

20. The method of claim 12, wherein the etching through the uncovered part of the second electrically conductive material in the connecting regions comprises a predominantly anisotropic plasma etch having an isotropic etch component that provides a degree of lateral undercut of the second electrically conductive material in the connecting regions.

21. The method of claim 9, wherein each gate electrode and field electrode disposed in the same trench are separated from each other by an insulating material, wherein the gate electrode is dielectrically insulated from the semiconductor substrate by a gate dielectric, and wherein the insulating material and the gate dielectric are formed by a same thermal oxidation process.

22. A semiconductor device, comprising:

a semiconductor substrate;

a plurality of trenches formed in the semiconductor substrate and extending lengthwise in parallel with one another, the plurality of trenches having connecting regions which interconnect adjacent ones of the trenches;

semiconductor mesas separated from one another by the plurality of trenches in a first lateral direction and by the connecting regions in a second lateral direction transverse to the first lateral direction; and a gate electrode and a field electrode below the gate electrode in at least some of the trenches, and dielectrically insulated from each other and from the semiconductor substrate, wherein the gate electrodes and the field electrodes are contacted separately and independently such that the gate electrodes are uninterrupted over the length of the trenches.

* * * * *